United States Patent
Lendriet

(10) Patent No.: US 6,697,689 B2
(45) Date of Patent: Feb. 24, 2004

(54) METHOD FOR CONCEALING A CELL SITE RADIO FREQUENCY ANTENNA SYSTEM

(76) Inventor: Brent W. Lendriet, 506 S. Kenwood La., Chandler, AZ (US) 85226

( * ) Notice: Subject to any disclaimer, the term of this patent is extended or adjusted under 35 U.S.C. 154(b) by 47 days.

(21) Appl. No.: 10/029,045

(22) Filed: Dec. 20, 2001

(65) Prior Publication Data

US 2003/0144821 A1 Jul. 31, 2003

(51) Int. Cl.⁷ .............................................. G06F 19/00
(52) U.S. Cl. ........................ 700/97; 52/646; 342/872; 342/873
(58) Field of Search ................... 700/97; 324/627; 52/646, 726.3; 343/872, 873

(56) References Cited

U.S. PATENT DOCUMENTS

| | | | |
|---|---|---|---|
| 5,349,362 A | * 9/1994 | Forbes et al. | 343/873 |
| 5,787,649 A | 8/1998 | Popowych et al. | 52/40 |
| 5,889,496 A | * 3/1999 | Maas | 343/791 |
| 6,122,866 A | * 9/2000 | Thomas et al. | 52/726.3 |
| 6,222,503 B1 | 4/2001 | Gietema et al. | 343/890 |
| 6,456,255 B1 | * 9/2002 | Lundahl | 343/872 |

* cited by examiner

Primary Examiner—Albert W. Paladini

(74) Attorney, Agent, or Firm—Jordan M. Meschkow; Lowell W. Gresham; Meshchkow & Gresham, PLC

(57) ABSTRACT

A method (102) of concealing a cell site radio frequency (RF) antenna (22) at a location (24) calls for generating a configuration (48, 62, 166) of an antenna screen structure (20) to determine geometrical parameters of the configuration. A set of instructions (108) are executed on a processor to evaluate the configuration (48, 62, 166) of the antenna screen structure (20). The instructions (108) direct the processor to perform operations that include defining geometrical parameters of the configuration (110), obtaining structural parameters of the configuration (112), receiving a wind load value for the location (114), and computing a maximum deflection value of the configuration in response to the geometrical parameters, the structural parameters, and the wind load value (128). In addition, the instructions (108) direct the processor to assess a cost (132) and a weight (130) of the configuration. When the maximum deflection value is less than a deflection limit value, the method (102) determines that the configuration of the antenna screen structure has acceptable structural integrity (154). The instructions (108) may be re-executed to determine a lower cost configuration for the antenna screen structure that also exhibits acceptable structural integrity. A selected configuration of the antenna screen structure is subsequently fabricated to imitate an appearance of a structure at the location (24), and the antenna screen structure (20) and the cell site RF antenna (22) are mounted at the location (24) so that the antenna (22) is hidden from an observer.

22 Claims, 9 Drawing Sheets

| ID | DEFLECTION COMPARISON ||||||| TOTAL WEIGHT | TOTAL COST |
| | SCREEN FACE UPPER SECTION || SCREEN FACE LOWER SECTION || BEAM DEFLECTION FIELD ||| | |
| | D MAX (upper) | D LIM (upper) | D MAX (lower) | D LIM (lower) | D MAX (upper beam) | D MAX (lower beam) | D LIM (beam) | | |
|---|---|---|---|---|---|---|---|---|---|
| 1 | .92 | .77 | - | - | - | - | - | 634 | 7077 |
| 2 | .29 | .44 | .23 | .25 | .27 | .14 | .66 | 787 | 8037 |
| 3 | .645 | .77 | - | - | .8 | - | .82 | 747 | 7876 |
| . | | | | | | | | | |
| . | | | | | | | | | |
| . | | | | | | | | | |
| n | | | | | | | | | |

FIG. 9

METHOD FOR CONCEALING A CELL SITE RADIO FREQUENCY ANTENNA SYSTEM

TECHNICAL FIELD OF THE INVENTION

The present invention relates to the field of radio frequency (RF) antenna systems. More specifically, the present invention relates to methods and structures for concealing RF antenna systems.

BACKGROUND OF THE INVENTION

Cellular communications networks utilize radio frequency (RF) antenna systems at "cell sites" to transmit and receive RF signals. Cell sites are typically spaced from three to eight miles apart to achieve acceptable results. Consequently, a large metropolitan area can include hundreds of individual sites to insure thorough coverage. RF antenna systems are typically attached to the sides or rooftops of buildings, or are mounted on new or existing tower structures. The RF antenna systems are generally enclosed in housings to prevent the antennas from being damaged by the environment or mishandling. These housings often have the unsightly appearance of large boxes on sides of buildings and rooftops, or hanging from towers. To compound the problem, an array of antennas of varying sizes and shapes for several different systems are often found on a common tower.

The general public and the municipal zoning boards are becoming increasingly and vehemently intolerant of RF antenna systems and antenna towers in their communities. This intolerance is due to the visual undesirability of the systems and the perception that the presence of the antenna systems and towers has an adverse effect on local property values. These opinions increase the resistance to building additional sites within communities to provide service to the ever rising number of wireless communications subscribers.

The preferred locations for placement of RF antenna systems are typically the tallest available locations relative to the surrounding terrain within the intended coverage area. The tallest available location ensures that the line of sight will most likely be free of obstructions that may reflect electromagnetic waves from the direction of the desired coverage. Antennas mounted on the sides or roofs of buildings or mounted on towers atop the most prominent, visible locations within the surrounding landscape greatly exacerbates the aesthetics problem.

To reduce the objectionable aesthetics of RF antenna systems, concealment strategies have been attempted to make them blend within the existing architecture of a building or a location. Such concealment attempts include hiding antennas behind "screen" structures and within church steeples and bell towers, mounting antennas on streetlamps, decorative towers, and utility poles, disguising conventional antennas as flagpoles and trees, and so forth. Such strategies have achieved only limited success in terms of aesthetics because disguises often do not appear natural and because of the limited availability of existing structures onto which antennas may be mounted.

In addition to aesthetic effectiveness, the successful concealment of RF antenna systems entails the consideration of a number of constraints when designing, fabricating, and mounting antenna screen structures. These constraints include, for example, the structural soundness within the requirements of the local and/or regional building codes, the introduction of minimal detrimental effects on the RF signal, the ability to resist degradation from environmental effects, and the capability for relatively quick installation. Ideally, all of these constraints should be satisfied, or balanced, while maintaining economic viability.

One typical concealment approach is to use multiple common structural elements made from fiber reinforced plastic (FRP), such as, angle, channel, tubing, I-beams, and plates. Using these elements, a screen structure is designed and assembled as though the structural elements were metal pieces. Unfortunately, such a design requires hundreds, and even thousands of fasteners, to hold it together, thus increasing the complexity and cost of assembly.

Another concealment approach is a hybrid of the multiple elements approach. This hybrid approach reduces some of the complexity of the multiple elements approach and improves the aesthetics by making modular wall panels arranged in long rows. This hybrid approach uses a minimal amount of custom tooling (molds), thus decreasing the cost of the screen structures over the multiple elements approach.

In order to enhance customer satisfaction, RF signal degradation in the cellular network should desirably be kept at a minimum. The placement of any matter, including screen structures, will present some degree of adverse effect on RF signals. A predominant factor that affects RF signals is the cross-sectional mass of the material. That is, the greater the mass between an antenna and a receiver, the greater the effect on the signal. This problem of cross-sectional mass is exacerbated when beams and columns that support the screen structure are in the signal path. A horizontal beam in the signal path can introduce a small signal disturbance, generally in the form of a phase-shift. In contrast, vertical columns (and diagonal brackets) in the signal path introduce significant RF attenuation and phase shift. The multiple element concealment approach and the hybrid approach can suffer from RF degradation due to the beams and columns in the signal path that are used to fabricate the screen structures.

Radio system planners are typically required to perform a structural analysis of a proposed configuration of an antenna screen structure to evaluate the stresses and strains to which the proposed screen structure will or might be subjected. The analysis of a multiple element construct of a structure typically employs familiar conventions used in the analysis of structures of metal, wood, concrete, and so forth. Unfortunately, these familiar conventions do not capitalize on the properties of the materials used to manufacture RF transparent screen structures. In addition, a multiple element construct of a screen structure, such as the multiple element and the hybrid concealment approaches may undesirably complicate the structural analysis, thus increasing the time and costs associated with performing such an analysis. Furthermore, changes to the configuration of the proposed screen structure that demand further structural analysis again results in adverse time and cost affects.

SUMMARY OF THE INVENTION

Accordingly, it is an advantage of the present invention that a method for concealing a cell site radio frequency (RF) antenna system is provided.

It is another advantage of the present invention that a computer-based method is provided that evaluates a configuration of an antenna screen structure and rapidly assesses structural integrity and cost information.

Yet another advantage of the present invention is that a method is provided that balances aesthetic effectiveness, RF degradation potential, structural integrity, and cost considerations in the design, fabrication, and installation of antenna screen structures.

The above and other advantages of the present invention are carried out in one form by a method of concealing a cell site radio frequency (RF) antenna at a location. The method calls for generating a configuration of an antenna screen structure to determine geometrical parameters of the configuration. A set of instructions are executed on a processor to evaluate the configuration of the antenna screen structure. The instructions direct the processor to perform operations that include obtaining structural parameters of the configuration, receiving a wind load value for the location, and computing a maximum deflection value of the configuration in response to the geometrical parameters, the structural parameters, and the wind load value. When the maximum deflection value is less than a deflection limit value, the method determines that the configuration of the antenna screen structure has acceptable structural integrity. The configuration of the antenna screen structure is fabricated to imitate an appearance of a structure at the location, and the antenna screen structure and the cell site RF antenna are mounted at the location so that the cell site RF antenna is hidden from an observer.

The above and other advantages of the present invention are carried out in another form by a computer-based method for evaluating a configuration of an antenna screen structure formed to conceal a cell site radio frequency (RF) antenna at a location. The computer-based method calls for defining geometrical parameters of the configuration, obtaining structural parameters of the configuration, and receiving a wind load value for the location. A maximum deflection value of the configuration is computed in response to the geometrical parameters, the structural parameters, and the wind load value. The maximum deflection value is compared to a deflection limit value, and the configuration of the antenna screen structure is determined to have acceptable structural integrity when the maximum deflection value is less than the deflection limit value.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 9 shows a table of summary values generated through the execution of the antenna screen evaluation routine.

DETAILED DESCRIPTION OF THE PREFERRED EMBODIMENTS

Many major cities either already have, or will have, codes that demand concealment of a cell site. The concealment of an cell site radio frequency (RF) antenna is a complex aspect of building a cell site for a telecommunications provider. When developing an antenna screen structure, the telecommunications provider must ideally balance aesthetic effectiveness, structural requirements, transparent RF properties, quick turn-around time, and reasonable cost. To further complicate the situation, each potential cell site is unique. That is, no single antenna screen structure design, shape, size, finish, color, or attachment method will suffice for the vast variety of cell site installation locations.

FIGS. 1–6 and 10 show exemplary configurations of antenna screen structures that may be used to conceal a cell site RF antenna. The present invention provides methodology for generating a configuration of an antenna screen structure, such as those shown in FIGS. 1–6 and 10. In addition, the present invention provides methodology for evaluating the configuration for structural integrity, assessing the cost of the configuration, and fabricating and mounting the antenna screen structure.

Figure 1:
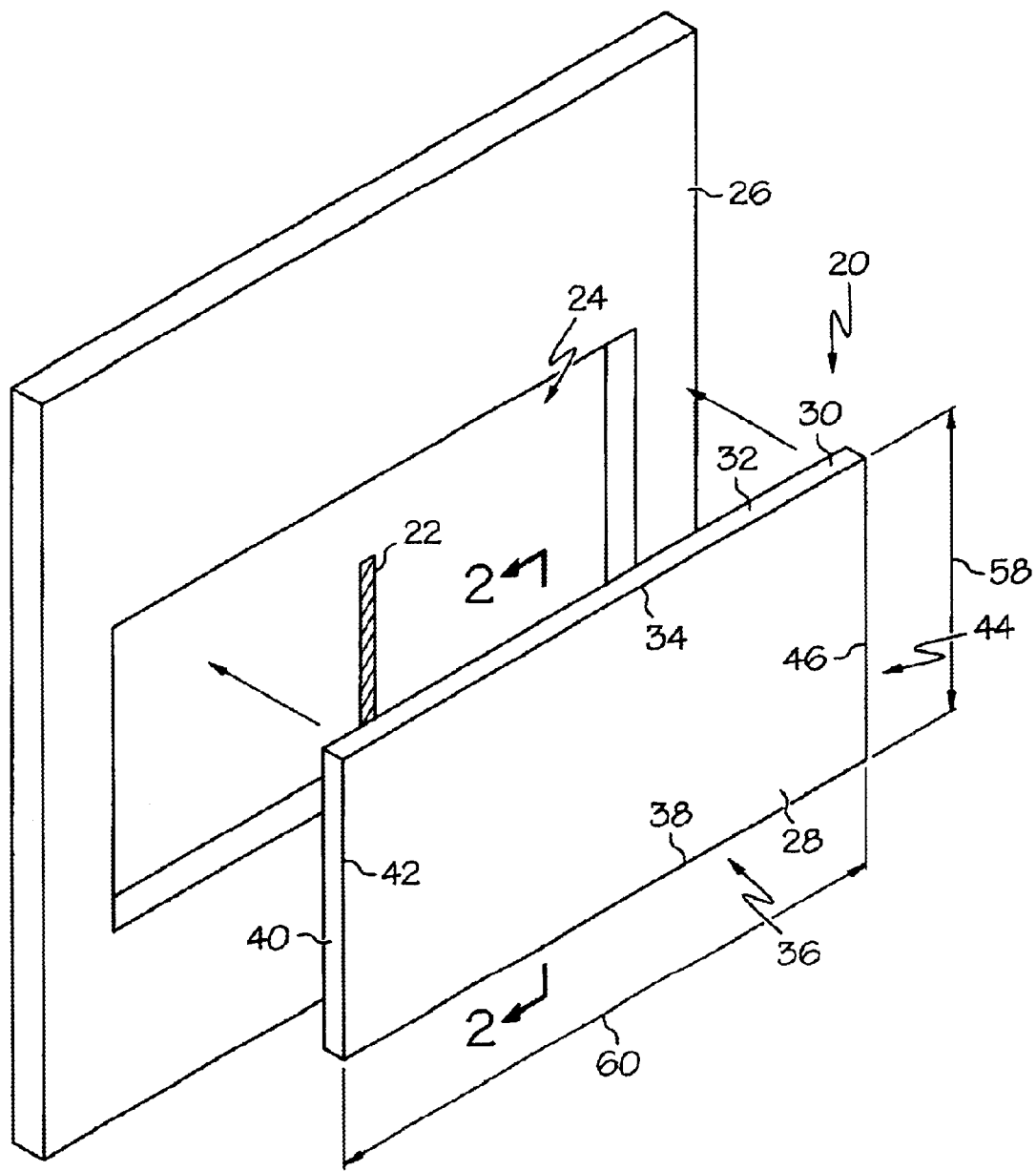
FIG. 1 shows a perspective front view of an exemplary antenna screen structure for concealing a cell site radio frequency antenna.

FIG. 1 shows a perspective front view of an exemplary antenna screen structure 20 for concealing a cell site RF antenna 22. Antenna screen structure 20 is configured to fit at a specified location 24, or opening, in the side of a building 26.

Antenna screen structure 20 includes an RF transparent screen face 28 and a peripheral support 30 integral to screen face 28. More particularly, peripheral support 30 includes a first horizontal flange 32 on an upper edge 34 of screen face 28 and a second horizontal flange 36 on a lower edge 38 of screen face 28. In addition, peripheral support 30 includes a first vertical flange 40 on a first side edge 42 of screen face 28 and a second vertical flange 44 on a second side edge 46 of screen face 28.

In a preferred embodiment, screen face 28 and peripheral support 30 are formed as a single unit from fiberglass-reinforced plastic (FRP). Peripheral support 30, in the form of first and second horizontal flanges 32 and 36 and first and second vertical flanges 40 and 44, is a continuous flange member integral to screen face 28 to provide dimensional stability of screen structure 20, to serve as a stiffening element, and to provide a convenient concealed mounting surface for screen structure 20. The FRP medium allows the passage of radio frequency signals, is non-conductive, non-magnetic, and resistant to degradation from environmental effects.

Figure 2:
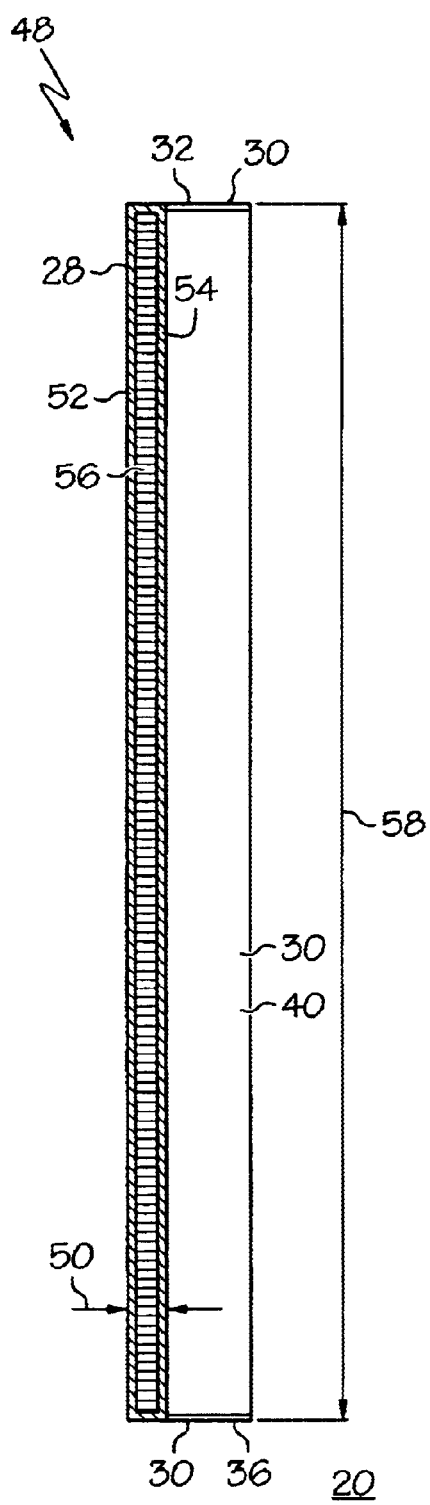
FIG. 2 shows a sectional side view of a first configuration of the antenna screen structure of FIG. 1.

Referring to FIG. 2 in connection with FIG. 1, FIG. 2 shows a sectional side view of a first configuration 48 of antenna screen structure 20 (FIG. 1) along a section 2—2. Screen face 28 is supported at the periphery by peripheral support 30. The support at the periphery, in place of the traditionally used columns, beams, and other stiffeners within the propagation path of the radio frequency (RF) signals, is advantageous because the lower the mass between a transmitter and a receiver, the lower the signal attenuation and phase shift. Thus, the configuration of screen face 28 and peripheral support 30 of antenna screen structure 20 forms an RF transparent "window", while still conforming to rigid structural requirements. Peripheral support 30 is anchored into the existing structure of building 26 at location 24.

One technique for making screen face 28 stiffer, while maintaining support of screen face 28 solely at the periphery, is to increase a thickness 50 of screen face 28. In the case of a solid FRP screen face (not shown), increasing thickness 50 causes screen face 28 to become less RF transparent. That is, attenuation of the radio frequency signals transmitted from and received by antenna 22 increases as thickness 50 of solid FRP increases. Accordingly, the present invention contemplates a solid FRP construct for screen face 28 of certain spans (i.e., height and width), in which the use of solid FRP may be acceptable without compromising the structural integrity of antenna screen structure, or the ability of the antenna screen structure to withstand predicted maximum wind loading without damage.

However, when the height or width of screen face 28 exceeds particular height and/or width criteria the present invention contemplates a cored construct in order to increase stiffness and maintain support of screen face 28 solely at the periphery. First configuration 48 of screen face 28 is of a cored laminate construct. In particular, screen face 28 includes a first FRP layer 52, a second FRP layer 54, and a stiffener core 56 interposed between first and second FRP layers 52 and 54, respectively.

In a preferred embodiment, stiffener core 56 is a stiffness element of screen face 28 formed of a thermoplastic honeycomb layer. Stiffener core 56 provides additional rigidity through a height 58 and a width 60 (see FIG. 1) of screen face 28, and causes very little attenuation of the RF signal. For clarity, stiffener core 56 is referred to hereinafter as thermoplastic honeycomb layer 56. However, it should be apparent to those skilled in the art that alternative materials may be employed as the stiffener core in place of thermoplastic honeycomb layer 56. For example, rigid foam or three-dimensional woven fiber materials may be used that cause little attenuation of the RF signal and provide rigidity.

In a preferred embodiment, first and second FRP layers 52 and 54 are each in the range of 0.09 to 0.12 inches thick, while thermoplastic honeycomb layer 56 is in the range of 0.5 to 2 inches thick. The cored construct enables spans of six feet between stiffening members.

Screen face 28 is shown as being flat for simplicity of illustration. However, screen face 28 may actually have molded-in details and reliefs that imitate the appearance of the surrounding structure, i.e., building 26. However, these details and reliefs are shallow compared to height 58 and width 60, so that screen face 28 may be evaluated as a flat plate.

Figure 3:
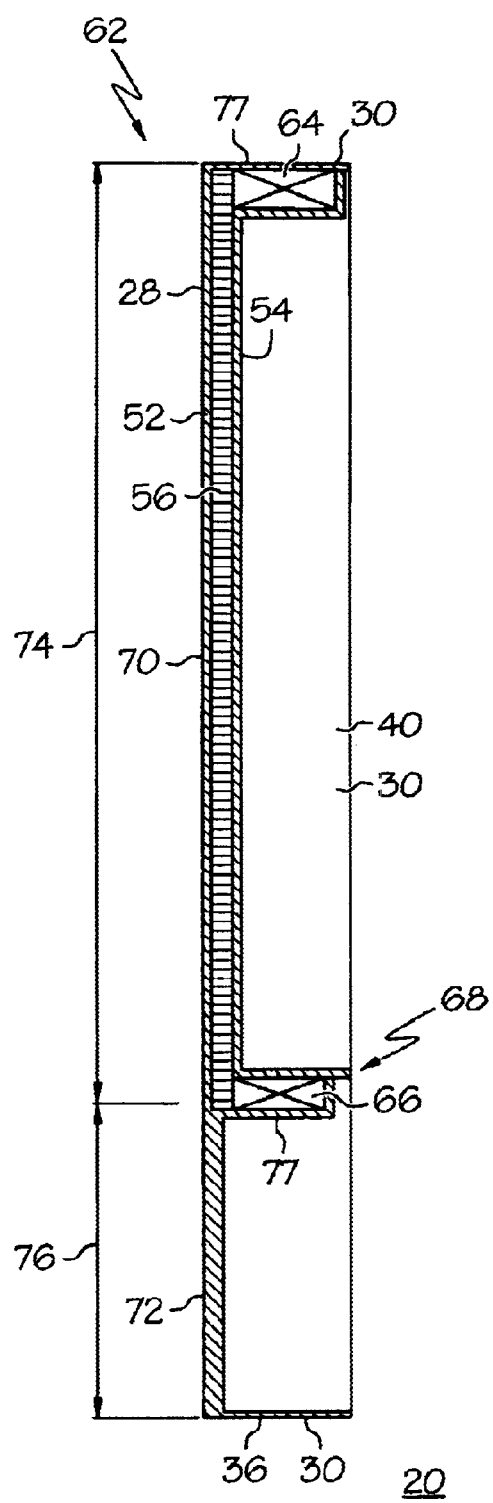
FIG. 3 shows a sectional side view of a second configuration of the antenna screen structure of FIG. 1.

FIG. 3 shows a sectional side view of a second configuration 62 of antenna screen structure 20. When height 58 (FIG. 2) or width 60 (FIG. 1) exceeds certain practical limits for the cored construct of first configuration 48 (FIG. 2), stiffeners may be used to provide antenna screen structure 20 with sufficient structural integrity. Thus, second configuration 62 includes a first beam member 64, second horizontal flange 36, and a second beam member 66, each of which span width 60 (FIG. 1) of screen face 28.

First beam member 64 replaces first horizontal flange 32 (FIG. 2) of first configuration 48 (FIG. 2). In addition, second beam member 66 is a horizontal intermediate support member 68 that provides stiffness at an intermediate position along screen face 28. First and second beam members 64 and 66 are used to transfer loads from screen face 28 horizontally to peripheral support 30. Horizontal intermediate support member 68 forms a border between an upper section 70 and a lower section 72 of screen face 28, and may be shifted vertically to adjust a height 74 of upper section 70 and a height 76 of lower section 72. First and second beam members 64 and 66, respectively, may be a laminated wood product, metal, or FRP, may be a number of sizes and shapes, and may be hollow or solid.

In addition, a skin 77, formed from fiber reinforced plastic (FRP), encases first and second beam members 64 and 66 to form antenna screen structure 20 as a single unit. Peripheral support 30, in the form of first and second horizontal flanges 32 and 36 (FIG. 1), respectively, and first and second vertical flanges 40 and 44 (FIG. 1), respectively, provide some beam characteristics. However, a flange by itself may not be able to carry significant loads, unless the flange is fastened to another structurally capable member or an existing building. Accordingly, when antenna structure 20 is unsupported along its length, first and second beam members 64 and 66 may be incorporated into the flange material (i.e., skin 77) during manufacturing so that a separate beam need not be fastened to screen face 28.

As shown in FIG. 3, upper section 70 of configuration 62 is of a cored construct and forms a window through which RF signals propagate to and from receiving and transmitting elements (not shown) of antenna 22. More specifically, upper section 70 includes first and second FRP layers 52 and 54, respectively, and thermoplastic honeycomb layer 56. In contrast, the receiving and transmitting elements (not shown) of antenna 22 (FIG. 1) are not located behind lower section 72. As such, lower section 72 may be of a solid FRP construct for ease of construction, and materials and fabrication cost savings.

Figure 4:
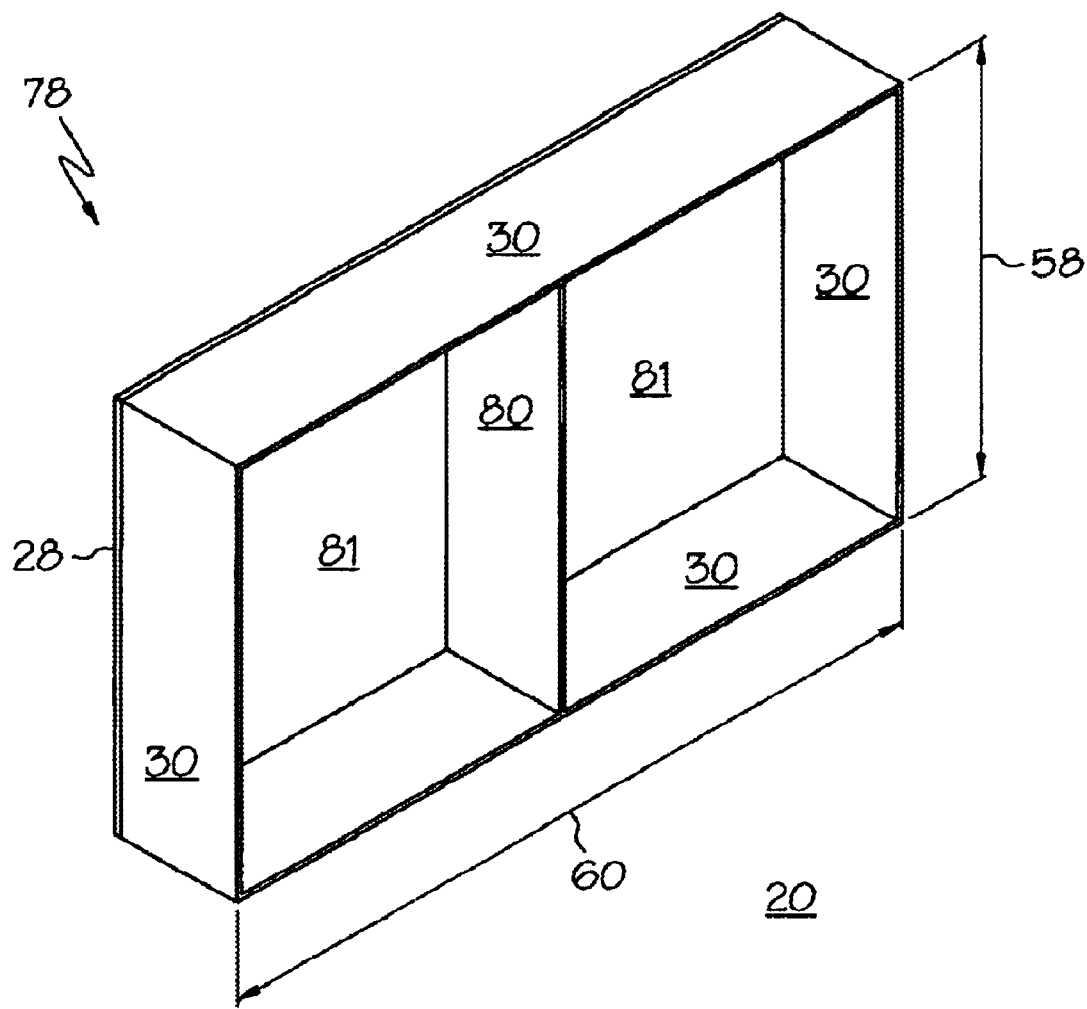
FIG. 4 shows a perspective rear view of a vertical beam configuration of the antenna screen structure of FIG. 1.

FIG. 4 shows a perspective rear view of a vertical beam configuration 78 of antenna screen structure 20. When width 60 exceeds certain practical limits for the cored construct of first and second configurations 48 and 62, respectively, one or more vertical support members 80 may be used to provide antenna screen structure 20 with sufficient structural integrity.

Vertical intermediate support members 80, of which only one is shown, span height 58 of screen face 28 to form a border between separate sections 81 of screen face 28. Vertical intermediate support member 80 may be utilized to conceal a number of antennas 22 (FIG. 1), for example, a single antenna 22 may be concealed behind each section 81. Thus, each of sections 81 forms a radio frequency transparent window through which RF signals propagate to and from a particular one of antennas 22. Vertical intermediate support member 80 is depicted as a solid FRP flange member. However, vertical intermediate support member 80 may alternatively be a beam member formed of wood, metal, or a composite material.

Peripheral support 30 of vertical beam configuration 78 may be a continuous flange member that resembles the form of first and second horizontal flanges 32 and 36, respectively, (FIG. 1) and first and second vertical flanges 40 and 44, respectively (FIG. 1). Peripheral support 30 of vertical beam configuration 78 may also include first and second beam members 64 and 66, respectively, as discussed in connection with second configuration 62 (FIG. 3). Vertical beam configuration 78 may further include first and second FRP layers 52 and 54, respectively, and thermoplastic honeycomb layer 56 shown in FIGS. 2–3.

Figure 5:
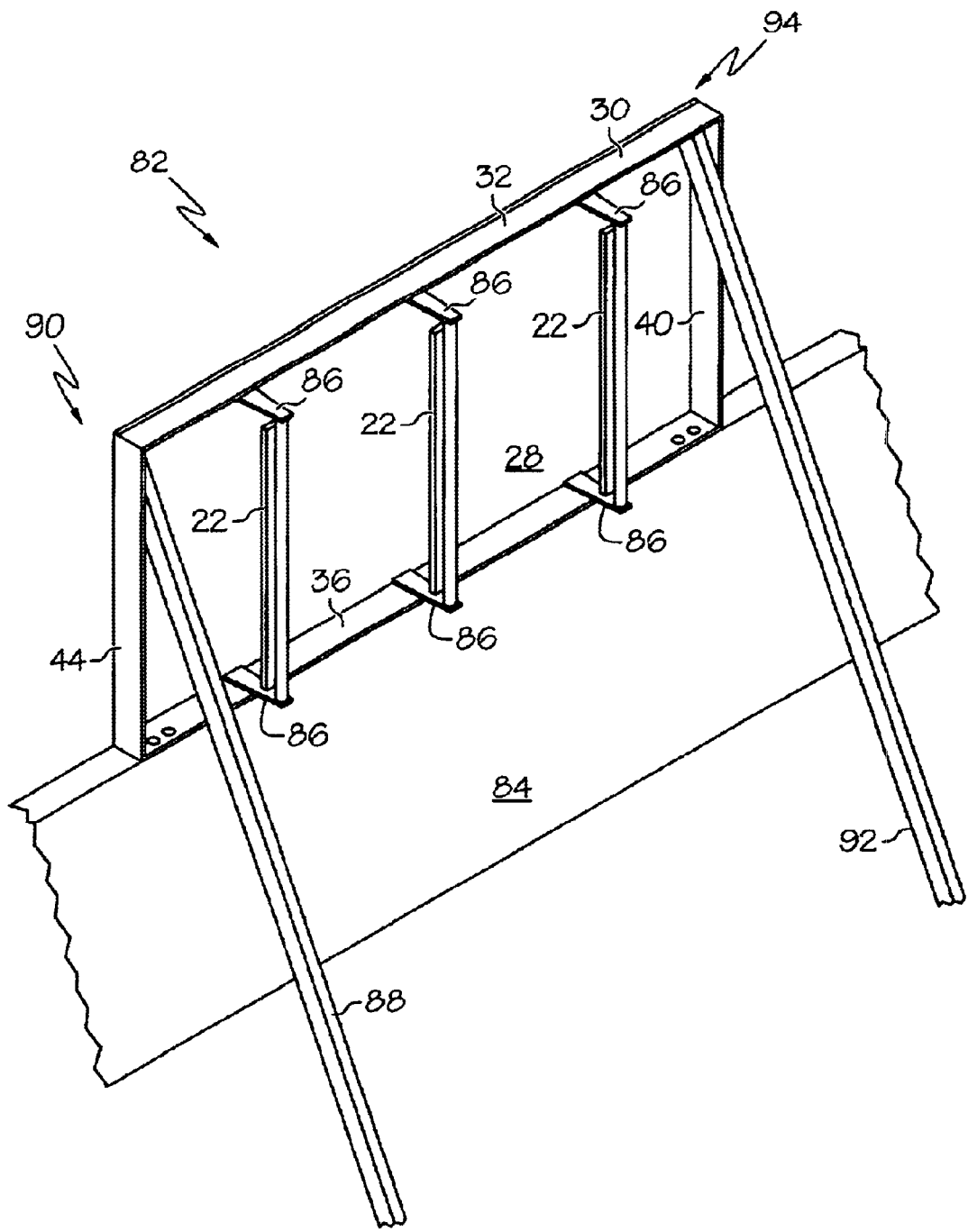
FIG. 5 shows a perspective rear view of a second exemplary antenna screen structure.

FIG. 5 shows a perspective rear view of a second exemplary antenna screen structure 82. Second antenna screen structure 82 is an adaptation of antenna screen structure 20 (FIG. 1) and is configured to be mounted to a parapet 84 of a building. Thus, antenna screen structure 82 includes RF transparent screen face 28 and integral peripheral support 30. As shown, peripheral support 30 includes first and second horizontal flanges 32 and 36, respectively, and first and second vertical flanges 40 and 44, respectively. Second horizontal flange 36 is configured to be coupled to parapet 84.

Antenna screen structure 82 further includes antenna mounts 86 onto which three cell site antennas 22 are secured. A first brace 88 is coupled at a first upper corner 90 of screen face 28 and a second brace 92 is coupled to a second upper corner 94 of screen face 28. Each of first and second braces 88 and 92, respectively, extend from first and second upper corners 90 and 94, respectively, and are configured to couple to the building.

Like antenna screen structure 20 (FIGS. 1–3), second antenna screen structure 82 may include a cored construct of first and second FRP layers 52 and 54, respectively, and thermoplastic honeycomb layer 56 shown in FIGS. 2–3. In addition to, or alternatively, peripheral support 30 of second antenna screen structure 82 may include first and second beam members 64 and 66 (FIG. 3), respectively, and/or vertical intermediate support member 80 (FIG. 4).

Figure 6:
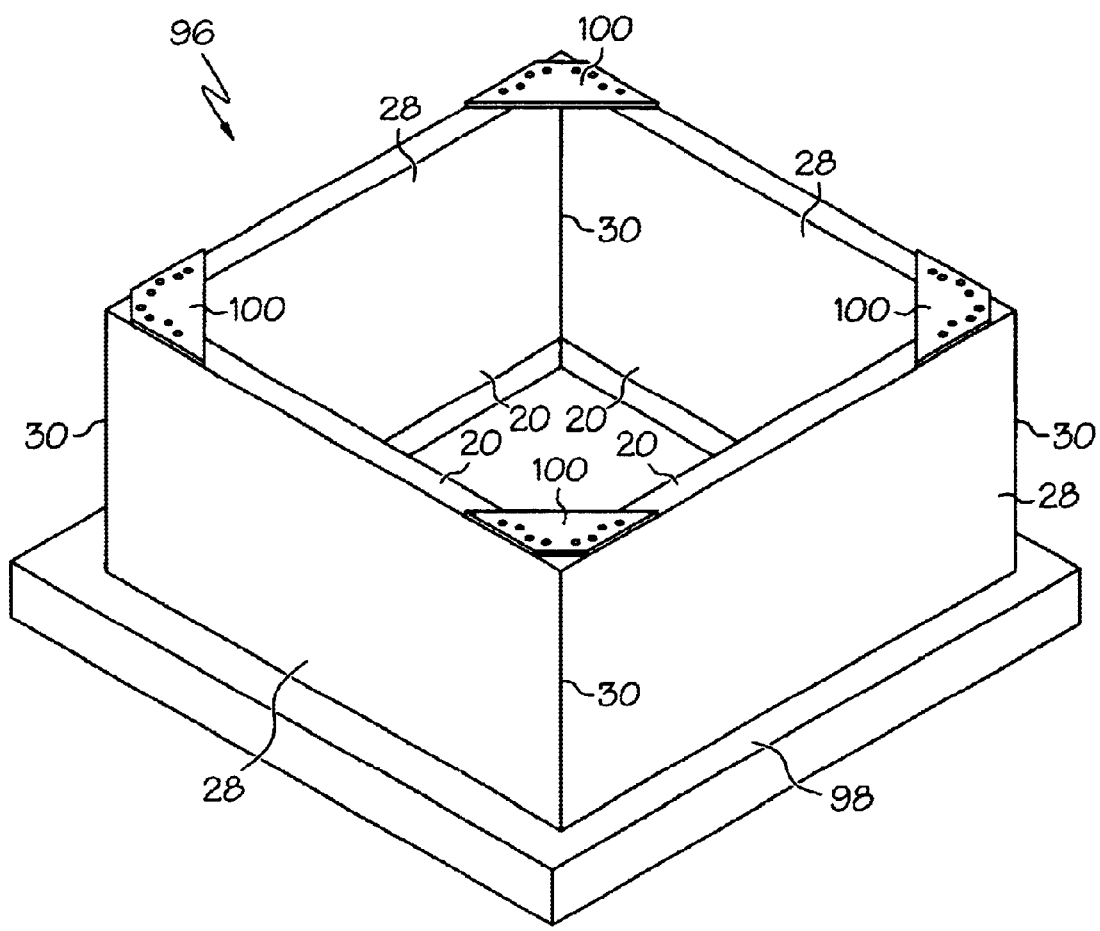
FIG. 6 shows a perspective view of a third exemplary antenna screen structure.

FIG. 6 shows a perspective view of a third exemplary antenna screen structure 96. Third antenna screen structure 96 is an adaptation of antenna screen structure 20 and is configured to be mounted to a roof 98 of a building. Third antenna screen structure 96 is a box-shaped structure and may be used to conceal one or more cell site RF antennas 22 (FIG. 1) from all sides.

Third antenna screen structure 96 is formed by coupling four of antenna screen structures 20 along peripheral supports 30. Thus, third antenna screen structure 96 includes four RF transparent screen faces 28. Corner gussets 98 may be used to provide additional strength at each corner of the box-shaped third antenna screen structure 96.

Third antenna screen structure 96 may include a cored construct of first and second FRP layers 52 and 54, respectively, and thermoplastic honeycomb layer 56 shown in FIGS. 2–3. Each peripheral support 30 may include first and second horizontal flanges 32 and 36, respectively, and first and second vertical flanges 40 and 44, respectively (FIG. 1). In addition to, or alternatively, peripheral support 30 of third antenna screen structure 96 may include first and second beam members 64 and 66 (FIG. 3), respectively, horizontal intermediate support member 68 (FIG. 3), and/or vertical intermediate support member 80 (FIG. 4).

The present invention efficiently evaluates a variety of proposed configurations of antenna screen structures, such as those described in connection with FIGS. 1–6, to characterize the structural integrity and assess the cost of a proposed antenna screen structure to determine the optimal antenna screen structure configuration (i.e. flanges, beams, cored, solid FRP, intermediate support members, and so forth) at the best cost. While nearly every cell site is unique, the present invention employs a fundamental arrangement of various "common" shapes, profiles, and sections. By using a small selection of different construction and detail types (elements), most antenna screen structures can be built by judicious arrangement and grouping of these elements.

Figure 7:
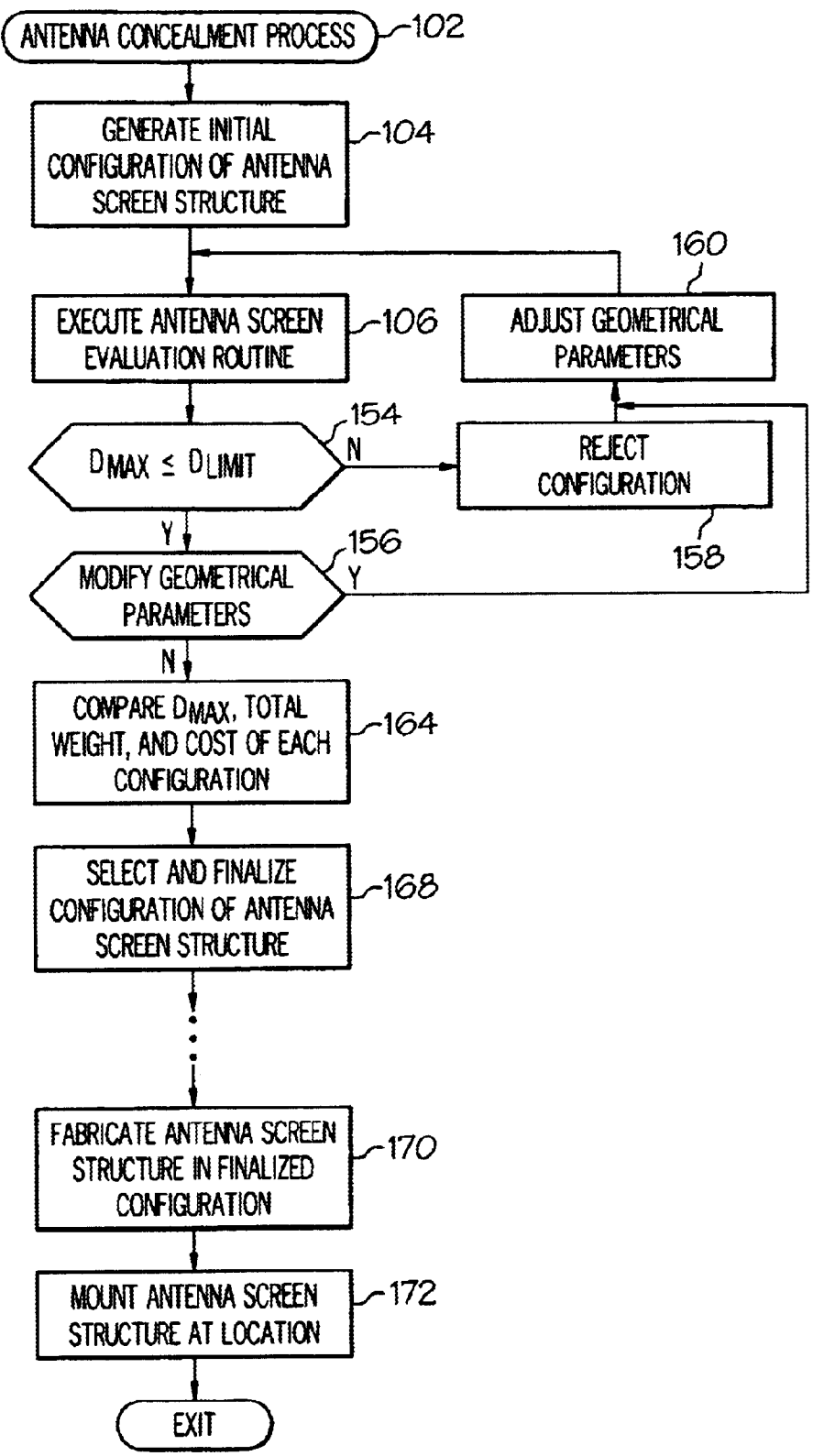
FIG. 7 shows a flow chart of an antenna concealment process in accordance with a preferred embodiment of the present invention.

FIG. 7 shows a flow chart of an antenna concealment process 102 in accordance with a preferred embodiment of the present invention. Antenna concealment process 102 is performed to design, fabricate, and install antenna screen structures while balancing the varied and overlapping constraints of aesthetic effectiveness, structural reliability, RF transparency, quick turn-around time, and reasonable cost.

Process 102 begins with a task 104. Task 104 calls for generating an initial configuration of an antenna screen structure. At task 104, a proposed cell site location, antenna screen structure concept, and antenna placement criteria are studied. Study can entail visiting the proposed site and obtaining dimensions, such as height 58 (FIG. 1) and width 60 (FIG. 1), of an antenna screen structure and obtaining details regarding the existing structure. Other information that can be obtained at a site visit include, for example, surface finish texture and color, site accessibility issues for installation of the antenna screen structure, site preparation for the antenna screen structure, and visual and aesthetic issues.

For clarity in the present discussion, the result of task 104 is the generation of first configuration 48 (FIG. 2) of antenna screen structure 20 (FIGS. 1–2). Following generating task 104, a task 106 is performed. At task 106, an antenna screen evaluation routine is executed.

Figure 8:
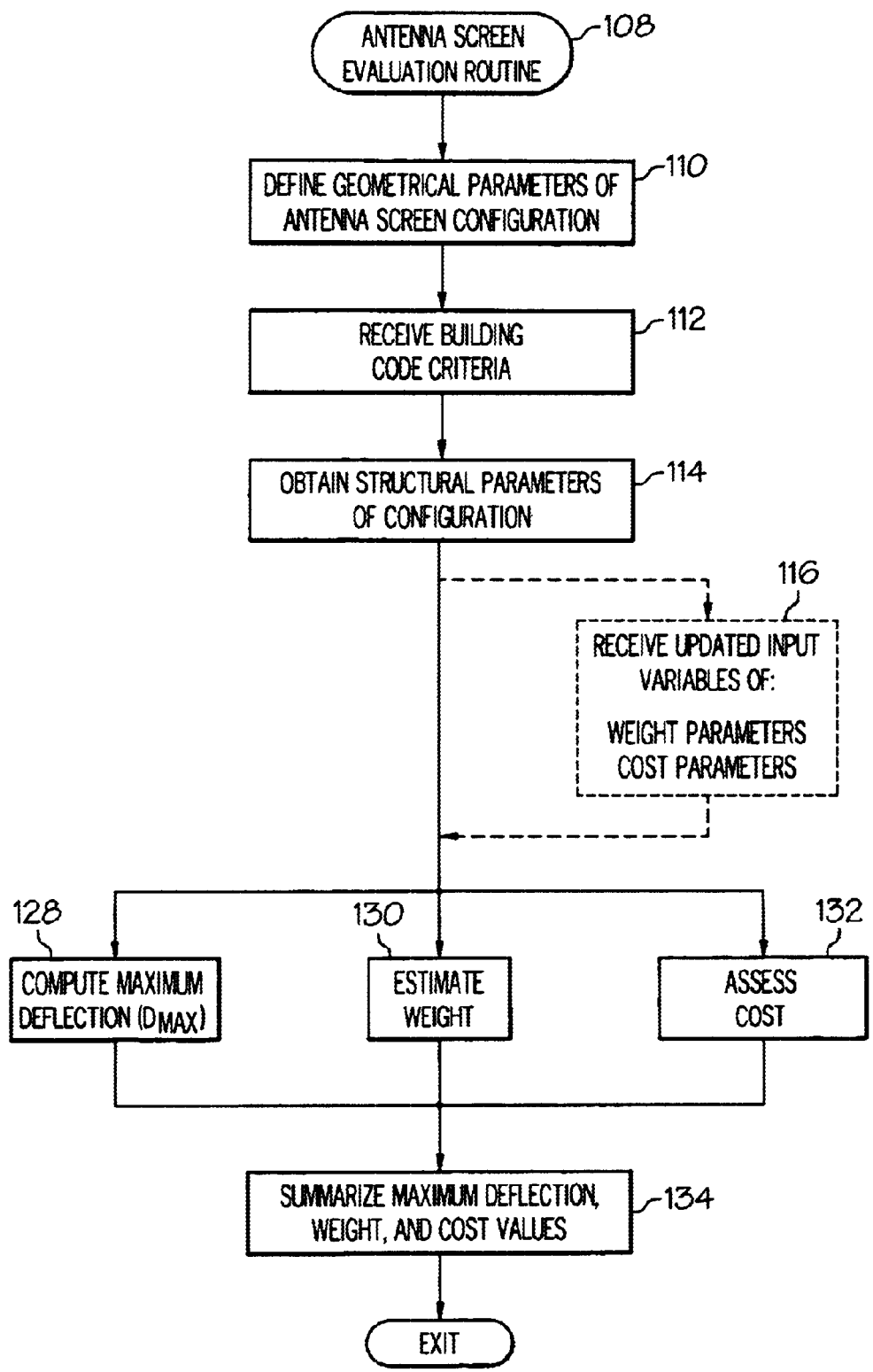
FIG. 8 shows a flow chart of an antenna screen evaluation routine.

FIG. 8 shows a flow chart of an antenna screen evaluation routine 108 executed at task 106 of antenna concealment process 102. Antenna screen evaluation routine 108 is a computer-based method for evaluating a proposed configuration, such as first configuration 48, of an antenna screen structure generated at task 104 (FIG. 7) of antenna concealment process 102 (FIG. 7). Antenna screen evaluation routine 108 may be advantageously employed to readily perform a structural analysis of a proposed configuration that accounts for the inherent properties of the materials used to construct the antenna screen structures, described above. Those skilled in the art will recognize that other routines, or alternatively manual methods, may be utilized to perform the structural analysis.

Antenna screen evaluation routine 108 may be executed on a computing system (not shown) that is implemented utilizing conventional components. For example, the computing system includes a processor, in communication with an input element (such as a mouse, keyboard, etc.), an output element (monitor, printer, etc.), a computer-readable storage medium, and memory. The computer-readable storage medium may be a hard disk drive internal or external to the processor, a magnetic disk, compact disk, or any other volatile or non-volatile mass storage system readable by the processor. The memory is addressable storage space, accessible by the processor, which stores information or instructions for use.

Executable code for instructing the processor to evaluate a configuration of an antenna screen structure is in the form of antenna screen evaluation routine 108 and is recorded on the computer-readable storage medium. In a preferred embodiment, routine 108 was assembled using TK Solver, created by Universal Technical Systems, Inc., Rockford, Ill. TK Solver is a rule-based declarative programming environment for creating mathematical models and solving them multidirectionally. TK Solver simplifies math models into the form of systems of equations and relationships which saves development time, and supports familiar forms of mathematical modeling. Those skilled in the art will recognize that other mathematical modeling tools may be employed in the assembly of antenna screen evaluation routine 108.

Through TK solver, formulas, otherwise known as rules, are entered into a "Rule Sheet" in any order. The variables that the formulas contain are automatically posted to a "Variable Sheet." The Variable Sheet has columns for input values and output values. A developer may then enter the desired input values, solve the model, and the output values of the model are provided. Throughout the following discussion, the formulas utilized in antenna screen evaluation routine 108 will be identified under the heading of "Rules" and the input and output values will be identified under the headings of "Input Variables" and "Output Variables", respectively.

Antenna screen evaluation routine 108 begins with a task 110. At task 110, the geometrical parameters of first configuration 48 (FIG. 2) of antenna screen structure 20 (FIG. 1) are defined. The geometrical parameters of antenna screen structure 20 define the proposed size, shape, thickness, and supports for antenna screen structure 20. The geometrical parameters are defined as input and output variables using the rules pertaining to the geometrical parameters. At task 110, routine 108 receives the input variables, entered by a designer, that were determined when the initial configuration of antenna screen structure 20 is generated at task 104 (FIG. 7) of antenna concealment process 102 (FIG. 7). Task 110 then defines, or computes, the output variables of the geometrical parameters using the rules pertaining to the geometrical parameters as follows:

| Input Variables (Geometrical Parameters) | |
| --- | --- |
| Dimensions: | |
| x | Height 58 (FIG. 1) of screen face 28, inches |
| a | Width 60 (FIG. 1) of screen face 28, inches |
| Stiffness Element: | |
| skin_t | Thickness of each of first and second FRP layers 52 and 54, respectively (FIG. 2), inches |
| core_t | Thickness of stiffener core, i.e. thermoplastic honeycomb layer 56 (FIG. 2), inches |
| Vertical Flanges: | |
| Num_C_flg | Quantity of first and second vertical flanges, 40 and 44, respectively |
| C_flg_wide | Width of first and second vertical flanges, 40 and 44 |
| C_flg_thk | Thickness of first and second vertical flanges, 40 and 44 |
| Horizontal Flanges: | |
| Num_P_flg | Quantity of first and second horizontal flanges, 32 and 36, respectively [When Num_P_flg is greater than 3 or when Num_P_flg is greater than 2 AND Num_Hbeams is at least 1, then computations include horizontal intermediate support member 68 configured to be a flange] |
| P_flg_wide | Width of first and second horizontal flanges, 32 and 36, inches |
| P_flg_thk | Thickness of first and second horizontal flanges, 32 and 36, inches |
| Horizontal Intermediate Support Members (beams): | |
| NUM_Hbeams | TOTAL quantity of horizontal beam members (i.e., first and second horizontal beam members 64 and 66 |
| BM1 | First beam member 64 (FIG.3) |
| i1b | Outer width of BM1 (perpendicular to screen face 28)) |
| i1d | Outer height of BM1 (parallel to screen face 28) |
| i1b1 | Inner width of BM1 (hollow tubes only) |
| i1d1 | Inner height of BM1 (hollow tubes only) |
| BM2 | Second beam member 66 (FIG. 3) is horizontal intermediate support member 68 (FIG. 3) |
| i2b | Outer width of BM2 (perpendicular to screen face 28) |
| i2d | Outer height of BM2 (parallel to screen face 28) |
| i2b1 | Inner width of BM2 (hollow tubes only) |
| i2d1 | Inner height of BM2 (hollow tubes only) |
| Output Variables (Geometrical Parameters) | |
| t | Total thickness of screen face 28 (FIG. 1) |
| NUM_MIDbeams | Quantity of horizontal intermediate support members 68 (FIG. 3) configured as beam members |

-continued

| | |
| --- | --- |
| b | Equal to x when NUM_MIDbeams=0 or equal to height 74 (FIG. 3) of upper section 70 (FIG. 3) when NUM_MIDbeams=1 |
| Rules (Geometrical Parameters for cored screen face 28 and second horizontal flange 36 attached to substrate) | | t=(skin_t*2)+core_t;Total thickness of screen face 28
IF NUM_Hbeams=1 THEN NUM_MIDbeams=0; quantity of horizontal intermediate support members 68 x=b
IF NUM_Hbeams=2 THEN NUM_MIDbeams=1; quantity of horizontal intermediate support members 68, therefore x≠b
IF x≠b THEN x=(b+b2) ELSE b2=0 ; x is total height, b is height 74 of upper section 70, and b2 is height 76 of lower section 72

Following task 110, a task 112 is performed. At task 112, routine 108 receives the building code criteria pertinent to location 24. The building code criteria is provided through local and/or regional Uniform Building Code (UBC) standards that regulate and control the design, construction, quality of materials, use, occupancy, location, and maintenance of all buildings and structures within a jurisdiction.

The most significant loads imposed on antenna screen structure 20 are the result of wind forces. Using the UBC standard, wind forces typically range from twenty-two to thirty-five pounds per square foot. A "standard" seventy mile-per-hour wind imposes approximately 12.7 psf. However, the UBC standard generally includes multipliers for site conditions and elevation that raise the wind load values. The building code criteria is defined as input and output variables using the rules pertaining to the building code criteria as follows:

| Input Variables (Building code criteria) | |
| --- | --- |
| psf_BASE | Baseline wind loading value |
| I_factor | Importance factor multiplier |
| E_factor | Elevation factor multiplier |
| SITE_factor | Site coefficient multiplier |
| Output Variables (Building code criteria) | |
| psf | Overall wind loading, lb/ft$^2$ |
| q | Wind loading distributed on screen face 28, psi |
| TOT_load | Total wind load value applied to screen face, lb |
| Rules (Building Code Criteria) | | psf=(psf_BASE*I_factor*E_factor*SITE_factor)
q=(psf/144) ;loading in psi
TOT_load=(q*a*x) ;total wind load Following task 112, a task 114 is performed. At task 114, routine 108 obtains the structural parameters of first configuration. Many systems require two fundamental criteria to be determined of any member. These two fundamental criteria are allowable stress and allowable deflection. In a preferred embodiment, antenna screen structure is fabricated in fiberglass-reinforced plastic (FRP). FRP has a very high level of allowable stress relative to stiffness. Consequently, a design that accommodates allowable deflection also accommodates allowable stress. However, stress may optionally be computed through manual processes at concentrated load points, such as fastener locations.

The structural parameters are obtained through known and extrapolated properties and characterize the strength of screen face 28, and first and second beam members 64 and 66. The structural parameters include, for example, the allowable deflection ratio of first and second beam members 64 and 66 and horizontal intermediate support member 68, and the allowable deflection ratio of screen face 28. Other structural parameters include the modulus of elasticity of screen face 28, or upper section 70 (FIG. 3) of screen face 28, and the modulus of elasticity of first and second beam members 64 and 66 and horizontal intermediate support member 68. The allowable deflection ratio of a member is a value to which the ratio between the span length of the member and the maximum deflection for the member is limited. The allowable deflection ratio depends in part upon member shape, member function as a structural component, and the type of loading. The modulus of elasticity of a member is the stress per unit elastic strain, expressed as a ratio between the stress placed on a material and the strain. That is, the modulus of elasticity is a measure of the stiffness of a material. The structural parameters are defined as input and output variables using the rules pertaining to the structural parameters as follows:

| Input Variables (Structural Parameters) | |
|---|---|
| L1 | Allowable deflection ratio for horizontal beams, i.e., first and second beam members 64 and 66 |
| L2 | Allowable deflection ratio for screen face 28 |
| E1 | Modulus of elasticity for screen face 28 |
| Output Variables (Structural Parameters) | |
| E_BM1 | Modulus of elasticity for first beam member 64 |
| E_BM2 | Modulus of elasticity for second beam member 66 |
| Rules (Structural Parameters) | |
| IF BM1=1 THEN E_BM1=2.9E7 ELSE E_BM1=2.1E6; 1 is a hollow rectangular beam type, 0 is a solid beam type | |
| IF BM2=1 THEN E_BM2=2.9E7 ELSE E_BM2=2.1E6; 1 is a hollow rectangular beam type, 0 is a solid beam type | |

The modulus of elasticity (E1) for screen face 28 is extrapolated by treating screen face 28 as a beam and using the formula for deflection, γ, from Table 3, case 1c, of *Roark's Formulas for Stress and Strain*, 5$^{th}$ edition, 1975, by Warren C. Young as follows:

$$\gamma = \frac{P(L)^3}{48(E)(I)}$$

therefore, $$E = \frac{P(L)^3}{48(\gamma)(I)}$$

where:
P=applied load=10 lb
L=length=24 in
γ=maximum deflection=0.02448 in
I=moment of inertia=0.465 in$^4$
and:
E1=253,000 psi With regard to first and second beam members 64 and 66, respectively, standard beam theory applies. Stress and deflection are a function of the applied loading per inch, the span, the modulus of elasticity, and the cross-sectional moment of inertia. The modulus of elasticity (E_BM1 and E_BM2) for each of first and second beam members 64 and 66, respectively, is determined in response to a composition of first and second beam members 64 and 66. For example, a beam formed from a laminated wood product exhibits a modulus of elasticity specific to that product, while a steel beam has a different modulus of elasticity specific to steel.

Following task 114, an optional task 116 may be performed, as denoted by dashed lines. Alternatively, program control may proceed to concurrent tasks 128, 130, and 132, discussed below. Optional task 116 detects the receipt of updated input variables of weight parameters and cost parameters, discussed below. Through the implementation of antenna screen evaluation routine 108 using the TK Solver mathematical modeling tool, all input variables may be adjusted. In a preferred embodiment, the input variables pertaining to material weight and cost are set to pre-determined default values. These pre-determined default values are utilized by routine 108 to determine a total weight and a total cost of a proposed antenna screen structure. However, these pre-determined default values of the input variables may be adjusted by the designer to accommodate different material characteristics and to accommodate changing costs in materials, processes, and so forth, to obtain revised weights and costs.

Exemplary pre-determined weight parameters are as follows:

| Input Variables (Pre-determined Cost Parameters) | |
|---|---|
| FR_adder | Adder for FR resin, $/lb |
| FRP_top_skin_cst_lb | Cost per pound for first and second FRP layers 52 and 54, $/lb |
| core_cost_ft | Cost of thermoplastic honeycomb layer 56, $/ft$^2$ |
| core_bond_cost_ft | Cost to bond first and second FRP layers 52 and 54 to thermoplastic honeycomb layer 56, $/ft$^2$ |
| beam_lam | Cost to laminate beams, $/lb |
| steel_cst_lb | Cost for steel beam members, $/lb |
| wood_cst_lb | Cost for wood beams, $/lb |
| stl_add | "Adder" for EACH steel beam fab cost, $ |
| wd_add | "Adder" for EACH wood beam fab cost, $ |
| C_flg_cst_lb | Cost to fabricate first and second vertical flanges 40 and 44, $/lb |
| P_flg_cst_lb | Cost to fabricate first and second horizontal flanges 32 and 36, $/lb |
| Finish_cost | Cost of texture finish, $/ft$^2$ |
| DETAILcost | DETAILING costs, $/ft$^2$ |
| DEScost | Design Cost, $ |
| MOLDcost | Mold costs, $ |
| SHIPcost | Shipping/packaging costs, $ |
| OTHERcosts | Other costs, $ |
| NUM_corners | Quantity of field-joints |
| corner_adder | Adder for field-joint corner accommodations, $ |

Exemplary pre-determined cost parameters are as follows:

| Input Variables (Pre-determined Weight Parameters) | |
|---|---|
| core_wt | Weight of thermoplastic honeycomb layer 56 per square foot, lb/ft$^2$ |
| FRP_density | Density of fiberglass-reinforced plastic, lb/ft$^3$ |
| BM1_lam_thk | BM1 FRP laminate thickness, inches |
| BM1_lam_thk | BM2 FRP laminate thickness, inches |
| Finish_thk | Thickness of applied finish, inches |

At optional task 116, the received weight and cost parameters are entered in the "Variables Sheet." Although, optional task 116 is described in connection with the execution of routine 108, it should be understood that input variables for weight and cost may be adjusted in the "Variables Sheet" at any time, not necessarily in connection with the execution of routine 108. Following task 114 or optional task 116 program control proceeds to concurrent tasks 128, 130, and 132.

Task 128 computes a maximum deflection value for the proposed configuration of the antenna screen structure in response to the geometrical parameters defined at task 110, the building code criteria received at task 112, and the structural parameters obtained at task 114. Similarly, task 130 estimates a total weight value for the proposed configuration, and task 132 assesses a total cost for the proposed configuration in response to the geometrical parameters defined at task 110, the building code criteria received at task 112, and the structural parameters obtained at task 114, as well as the pre-determined weight parameters, and pre-determined cost parameters. Tasks 128, 130, and 132 are interrelated and concurrent operations that are efficiently executed through the multidirectional capability of the TK solver mathematical modeling tool. For clarity of description, each of tasks 128, 130, and 132 are individually discussed below.

Task 128 computes structural conclusions of the proposed antenna screen configuration as follows:

| Output Variables (Structural Conclusions) | |
|---|---|
| Dlimit2 | Deflection limit of screen face 28 or upper section 70, $D_{LIM(upper)}$ |
| DEFplate | Maximum deflection at center of screen face 28 or upper section 70, $D_{MAX(upper)}$ |
| Dlimit3 | Deflection limit of lower section 72, $D_{LIM(lower)}$ |
| DEF1plate | Deflection at center of lower section 72, $D_{MAX(lower)}$ |
| Dlimit1 | Deflection limit of beam members, $D_{LIM(beam)}$ |
| DEFbm1 | Deflection of first beam member 64, $D_{MAX(upper\_beam)}$ |
| DEFbm2 | Deflection of second beam member 66, $D_{MAX(lower\_beam)}$ |
| I1 | Moment of Inertia of first beam member 64, $in^4$ |
| I2 | Moment of Inertia of second beam member 66, $in^4$ |
| A | Alpha per Roark for upper section 70 |
| wtot | Wind load in pounds per inch-along horizontal length, lbs |
| wtot1 | Wind load on first beam member 64, lbs/in |
| wtot2 | Wind load on second beam member 66, lbs/in |

| Rules (Structural Conclusions) |
|---|
| ;MAXIMUM DEFLECTION VALUES OF SCREEN FACE 28, I.E. WIND LOADING: |
|    DEFplate=((A*q*b$^4$)/(E1*t$^3$)) ;$D_{MAX\ (upper\_section)}$ |
|    IF NUM_Hbeams=2 THEN DEF1plate=((A*q*b2$^4$)/(E1*t$^3$)) ELSE |
|       DEF1plate=0 ;$D_{MAX(lower\_section)}$ |
|    ;ALPHA Values for A, case 1, upper screen section cored construct |
|    IF and ((a/b)>0, (a/b)<=1.1) THEN A=.0138 |
|    IF and ((a/b)>1.1, (a/b)<=1.3) THEN A=.0188 |
|    IF and ((a/b)>1.3, (a/b)<=1.5) THEN A=.0226 |
|    IF and ((a/b)>1.5, (a/b)<=1.7) THEN A=.0251 |
|    IF and ((a/b)>1.7, (a/b)<=1.9) THEN A=.0267 |
|    IF and ((a/b)>1.9, (a/b)<=2.1) THEN A=.0277 |
|    IF and ((a/b)>2.1, (a/b)<=20) THEN A=.0284 |
|    ;MAXIMUM DEFLECTION VALUES OF BEAM MEMBERS, I.E. WIND LOADING |
|    wtot=(q*x) ; psi*total height |
|    wtot1=((q*(b/2))) |
|    IF x≠b THEN wtot2=(wtot1+(((b2/2)*q))) ELSE wtot2=0 |
|    IF BM1=1 THEN I1=(((i1d*i1b$^3$)−i1d1*i1b1$^3$))/12 ELSE |
|       I1=((i1d+BM1_lam_thk)*((i1b+(BM1_lam_thk*2))$^3$)/12) |
|    IF BM2=1 THEN I2=(((i2d*i2b$^3$)−i2d1*i2b1$^3$))/12 ELSE |
|       I1=((i2d+BM2_lam_thk)*((i2b+(BM2_lam_thk*2))$^3$)/12) |
|    IF NUM_Hbeams=1 THEN DEFbm1=((2*wtot1*(a$^4$))/ (384*E_BM1*I1)) |
|       ELSE DEFbm1=0 ;$D_{MAX(upper\_beam)}$ |
|    IF NUM_Hbeams=2 THEN DEFbm2=((2*wtot2*(a$^4$))/ (384*E_BM2*I2)) |
|       ELSE DEFbm2=0 ; $D_{MAX(lower\_beam)}$ |

| Rules (Structural Conclusions) |
|---|
| ;DEFLECTION LIMITS |
|    Dlimit1=(a/L1) ;deflection limits, beam members, $D_{LIM(beam)}$ |
|    Dlimit2=(b/L2) ;deflection limit, upper section 70, $D_{LIM(upper)}$ |
|    Dlimit3=(b2/L2 ;deflection limit, lower section 72, $D_{LIM(lower)}$ |

The values computed through the execution of task 128 include maximum deflection values ($D_{MAX}$) and deflection limit values ($D_{LIM}$) for a proposed configuration of an antenna screen structure.

Task 130 estimates weight conclusions of the proposed antenna screen configuration as follows:

| Output Variables (Weight Conclusion) | |
|---|---|
| Panel_WT | Estimated weight of antenna screen structure, lb |
| Top_FRP_wt | Weight of first and second FRP layers 52 and 54 |
| Face_wt | Total weight of screen face 28, lb |
| Atotal | Total surface area of screen face 28, $ft^2$ |
| BM1_wt | Weight of first beam member 64, lb |
| BM2_wt | Weight of second beam member 66, lb |
| TOT_BM_wt | Total weight of all beam members |
| BM1_lam_wt | Laminate weight of first beam member 64, lb |
| BM2_lam_wt | Laminate weight of second beam member 66, lb |
| TOT_BM_lam_wt | Total weight of laminate, lb |
| Beam_wt | Total weight of beam members and laminate, lb |
| C_flg_wt | Weight of first and second vertical flanges 40 and 44, lb |
| P_flg_wt | Weight of first and second horizontal flanges 32 and 36, lb |

| Rules (Weight Conclusion) |
|---|
| ;WEIGHT ESTIMATE OF ANTENNA SCREEN STRUCTURE |
| Panel_WT=((Face_wt+Beam_wt+Finish_wt+C_flg_wt+P_flg_wt) *1.1) |
| ;WEIGHT OF SCREEN FACE 28 |
| Face_wt=((Top_FRP_wt)+(core_wt+Atotal) |
| Top_FRP_wt=((a*x* (2*skin_t) FRP_density)) |
| Atotal=((a*x)/144) |
| ;WEIGHT OF BEAM MEMBERS |
| IF BM1=1 THEN BM1_wt=(((i1b*i1d)−(i1b1*i1d1))*a*.284) |
|    ELSE BM1_wt=(i1b*i1d*a*.03) |
| IF BM2=1 THEN BM2_wt=(((i2b*i2d)−(i2b1*i2d1))*a*.284) |
|    ELSE BM2_wt=(i2b*i2d*a*.03) |
| IF NUM_Hbeams=0 THEN TOT_BM_wt=0 |
| IF NUM_Hbeams=1 THEN TOT_BM_wt=BM1_wt |
| IF NUM_Hbeams=2 THEN TOT_BM_wt=(BM1_wt+BM2_wt) |
| ;WEIGHT OF LAMINATE BONDING ON BEAM MEMBERS |
| BM1_lam_wt=((((2*i1b)+(5*i1d))*BM1_lam_thk*FRP_density)*a) |
| BM1_lam_wt=((((2*i2b)+(5*i2d))*BM1_lam_thk*FRP_density)*a) |
| IF NUM_Hbeams=0 THEN TOT_BM_lam_wt=0 |
| IF NUM_Hbeams=1 THEN TOT_BM_lam_wt=BM1_lam_wt |
| IF NUM_Hbeams=2 THEN TOT_BM_lam_wt= (BM1_lam_wt+BM2_lam_wt) |
| ;TOTAL WEIGHT OF BEAM MEMBERS AND LAMINATE |
| IF NUM_Hbeams=0 THEN Beam_wt=0 |
|    ELSE Beam_wt=(TOT_BM_wt+TOT_BM_lam_wt) |
| ;WEIGHT OF FINISH TEXTURE |
| Finish_wt=((Atotal*144) *Finish_thk*FRp_density) |
| ;WEIGHT OF FIRST AND SECOND VERTICAL FLANGES 40 AND 44 |
| C_flg_wt=(C_flg_wide*x*Num_C_flg*C_flg_thk*FRP_density) |
| ;WEIGHT OF FIRST AND SECOND HORIZONTAL FLANGES 32 AND 26 |
| p_flg_wt=(p_flg_wide*a*Num_P_flg*P_flg_thk*FRP_density) |

The values estimated through the execution of task 130 include a total estimated weight and component weights for a proposed configuration of an antenna screen structure.

Task 132 assesses cost conclusions of the proposed antenna screen configuration as follows:

| Output Variables (Cost Conclusions) | |
|---|---|
| TOT_cost | Total cost of antenna screen structure |
| FACEcost | Cost to laminate screen face 28 |
| TOT_BM_cst | Total cost to supply beam members |
| BEAMfrp_cost | Total cost to apply FRP to beams |
| FINISHcost | Cost to finish screen face 28 |
| DETAIL_totcost | Cost for detail work on screen face 28 |
| C_flg_tot | Total cost of first and second vertical flanges 40 and 44 and setup |
| P_flg_tot | Total cost of first and second horizontal flanges 32 and 36 and setup |
| MISCcost | Total misc. costs (design, mold, shipping) |
| Cost_foot | Cost per foot |
| BM_cst1 | Cost for first beam member 64 |
| BM_cst2 | Cost for second beam member 66 |
| Top_face_cost | Cost for screen face 28 |
| C_flg_cost | Cost for first and second vertical flanges 40 and 44 |
| C_flg_setup | Setup cost for first and second vertical flanges 40 and 44 |
| P_flg_cost | Cost for first and second horizontal flanges 32 and 36 |
| P_flg_setup | Setup cost for first and second horizontal flanges 32 and 36 |
| Field_corner_cst | Cost for field joints |

| Rules (Cost Conclusions) |
|---|
| ;TOTAL COST OF ANTENNA SCREEN STRUCTURE |
|   TOT_cost=(FACEcost+BEAMfrp_cost+TOT_BMcst+ FINISHcost+DETAIL_totcost_MISCcost+C_flg_tot+P_flg_tot+ Field_corner_cost) |
| ;TOTAL COST OF ANTENNA SCREEN STRUCTURE PER SQUARE FOOT |
|   COST_foot=(TOT_cost/Atotal) |
| ;COST OF SCREEN FACE 28 |
|   tot_core_cst=(((a*x)/144)*((core_cost_ft+ Core_bond_cost_ft))+100) |
|   Top_face_cst=((Top_FRP_wt*FRP_top_skin_cst_lb)) |
|   FACEcost=((Top_face_cst+tot_core_cst)) |
| ;COST TO FABRICATE BEAM STRUCTURE |
|   IF BM1=1 THEN BM_cst1=((BM1_wt*steel_cst_lb)+stl_add) ELSE BM_cst1=(BM1_wt*wood_cst_lb)+wd_add |
|   IF BM2=1 THEN BM_cst2=((BM2_wt*steel_cst_lb)+stl_add) ELSE BM_cst2=(BM2_wt*wood_cst_lb)+wd_add |
|   IF NUM_Hbeams=0 THEN TOT_BM_cst=0 |
|   IF NUM_Hbeams=1 THEN TOT_BM_cst=BM_cst1 |
|   IF NUM_Hbeams=2 THEN TOT_BM_cst=(BM_cst1+BM_cst2) |
|   IF NUM_Hbeams=0 THEN BEAMfrp_cost=0 ELSE BEAMfrp_cost=(beam_lam_cost_lb* TOT_BM_lam_wt) |
| ;COST TO FINISH SCREEN FACE 28 |
|   FINISHcost=(140+(Atotal*finish_cost_ft) (Finish_wt*1.5)) |
| ;COST TO PERFORM DETAIL WORK ON SCREEN FACE 28 |
|   DETAIL_totcost=(Atotal*DETAILcost) |
| ;MISCELLANEOUS COSTS |
|   MISCcost=(DEScost+MOLDcost+SHIPcost+OTHERcost) |
| ;COST FOR FIRST AND SECOND VERTICAL FLANGES 40 AND 44 |
|   C_flg_cost=(C_flg_wt*C_flg_cst_lb) |
|   C_flg_tot=(C_flg_cost+C_flg_setup) |
|   IF C_flg_cost>0 THEN C_flg_setup=((((x/12)*8)+100)*Num_C_flg) ELSE C_flg_setup=0 |
| ;COST FOR FIRST AND SECOND HORIZONTAL FLANGES 32 AND 36 |
|   P_flg_cost=(P_flg_wt*P_flg_cst_lb) |

| Rules (Cost Conclusions) —continued |
|---|
|   P_flg_tot=(P_flg_cost+P_flg_setup) |
|   IF P_flg_cost>0 THEN P_flg_setup=((((a/12)*5)+40)*Num_P_flg) ELSE P_flg_setup=0 |
| ;COST FOR FIELD JOINTS |
|   Field_corner_cst=(NUM_corners*corner_adder) |

The values assessed through the execution of task 132 include a total cost and a cost breakdown for a proposed configuration of an antenna screen structure. Following concurrent tasks 128, 130, and 132, program control proceeds to a task 134.

At task 134, the maximum deflection, weight, and cost values are summarized for comparison.

Referring to FIG. 9 in connection with task 134, FIG. 9 shows an exemplary table 136 of summary values generated through the execution of antenna screen evaluation routine 108. Table 136 includes a configuration identifier field 138, a deflection comparison field 140, a total weight field 142, and a total cost field 144. Deflection comparison field 140 is divided into sub-fields corresponding to an upper section deflection field 146, a lower section deflection field 148, and a beam deflection field 150.

Exemplary table 136 is provided for illustrative purposes. Those skilled in the art will recognize that table 136 may take many forms. Moreover, those skilled in the art will recognize that the information summarized in table 136 is also presented in the "Output Variables" column generated through the execution of routine 108 (FIG. 8), as implemented through TK Solver, and need not be compiled in a separate table.

During an exemplary execution of routine 108, first configuration 48 (FIG. 2) was evaluated. First configuration 48 is identified by a first identifier 152, labeled "1", in configuration identifier field 138 and deflection, weight, and cost values are summarized in table 136 in association with first identifier 152. For example, in upper section deflection field 146 for first configuration 48, $D_{MAX(upper)}$ is paired with $D_{LIM(upper)}$. Similarly, in lower section deflection field 148 for first configuration, $D_{MAX(lower)}$ is paired with $D_{LIM(lower)}$. In beam deflection field 150 for first configuration 48, $D_{MAX(upper\_beam)}$ and $D_{MAX(lower\_beam)}$ are grouped with $D_{LIM(beam)}$.

With reference back to process 102 (FIG. 7) and routine 108 (FIG. 8), following summary task 134, antenna screen evaluation routine 108 exits and process control returns to a query task 154 of antenna concealment process 102 (FIG. 7). Query task 154 compares the maximum deflection values from wind loading, $D_{MAX}$, to the deflection limit values, $D_{LIM}$. When query task 154 determines that all of the maximum deflection values, $D_{MAX}$ from wind loading are less than or equal to the deflection limit values, $D_{LIM}$, process 102 proceeds to a query task 156 (discussed below). An affirmative response to query task 154 indicates that a structural integrity of the proposed configuration of antenna screen structure 20 is sufficient to withstand wind loading at a proposed cell site location, for example, location 24 (FIG. 1)

However, when query task 154 determines that any of the maximum deflection values, $D_{MAX}$ from wind loading are greater than the deflection limit values, $D_{LIM}$, process 102 proceeds to a task 158. Thus, a negative response to query task 154 indicates that a structural integrity of the proposed configuration of antenna screen structure 20 is insufficient to withstand wind loading at a proposed cell site location, for example, location 24 (FIG. 1)

Referring again to table 136 (FIG. 9) in connection with query task 154, each of upper section, lower section, and beam deflection fields 146, 148, and 150 associated with first identifier 152 are examined. Since first configuration 48 (FIG. 2) does not have first and second beam members, nor a horizontal intermediate beam member, lower section deflection field 148 and beam deflection field 150 are disregarded. As such, only $D_{MAX(upper)}$ and $D_{LIM(upper)}$ in upper section deflection field 146 are presented. In addition, a total weight of 634 lb is summarized in total weight field 142, and a total cost of $3024.00 is summarized in total cost field 144. As shown, $D_{MAX(upper)}$ is greater than $D_{LIM(upper)}$ and program control proceeds to task 158.

At task 158, the proposed configuration, i.e., first configuration 48, is rejected because $D_{MAX(upper)}$ reveals that first configuration 48 has insufficient structural integrity to withstand wind loading at location 24. Following task 158, process 102 proceeds to a task 160.

At task 160, the geometrical parameters of the proposed configuration of antenna screen structure 20 are adjusted to form a second configuration of antenna screen structure 20. For example, at task 160, a designer may modify the geometrical parameter set of input variables (discussed above) by, for example, adjusting height 58 (FIG. 1), width 60 (FIG. 1), or thickness 50 of screen face 28. In addition or alternatively, the designer may add one or both of first and second beam members 64 and 66, respectively.

A designer may modify the geometrical parameter set of input variables in an attempt to discover a configuration of antenna screen structure 20 (FIG. 1) that is a lower cost and/or simpler construct than other antenna screen configurations, yet still exhibits sufficient structural integrity. By way of example, the adjustment of geometrical parameters at task 160 results in second configuration 62 (FIG. 3).

Following task 160, process control loops back to task 106, and antenna screen evaluation routine 108 (FIG. 7) is re-executed to evaluate second configuration 62 of antenna screen structure 20 (FIG. 3). The re-execution of task 106, results in the computation of second maximum deflection values of second configuration 62 in response to the adjusted geometrical parameters, the structural parameters, and the wind loading criteria. Accordingly the second maximum deflection values may be compared at query task 154, following the re-execution of task 106.

Referring back to table 136 (FIG. 9), second configuration 62 is identified by a second identifier 162, labeled "2", in configuration identifier field 138 and deflection, weight, and cost values are summarized in table 136 in association with second identifier 162. In connection with query task 154, each of upper section, lower section, and beam deflection fields 146, 148, and 150 associated with second identifier 162 are examined. Since second configuration 62 includes first and second beam members 64 and 66, each of upper section deflection field 146, lower section deflection field 148 and beam deflection field 150 are considered. In addition, a total weight of 787 lb for second configuration 62 is summarized in total weight field 142, and a total cost of $8037.00 for second configuration is summarized in total cost field 144.

As shown, $D_{MAX(upper)}$ is less than $D_{LIM(upper)}$ for second configuration 62. Likewise, $D_{MAX(lower)}$ is less than $D_{LIM(lower)}$ and both $D_{MAX(upper\_beam)}$ and $D_{MAX(lower\_beam)}$ are less than $D_{LIM(beam)}$. The affirmative response at task 154 regarding deflection values of second configuration 62, indicates that second configuration 62 exhibits sufficient structural integrity to withstand wind loading at location 24 (FIG. 1), and process 102 proceeds to query task 156.

Query task 156 determines whether any the geometrical parameters are to be modified to further refine the design of antenna screen structure 20 (FIG. 1). Further refinement may be desirable to decrease weight and/or cost, or to simplify the design. For example, a designer may wish to modify the geometrical parameter set of input variables (discussed above) by, for example, adjusting height 58 (FIG. 1), width 60 (FIG. 1), or thickness 50 of screen face 28, or by adding or removing flanges and beam members. Query task 156 enables routine 108 to be an iterative process for assessing multiple configurations of an antenna screen structure to readily evaluate structural integrity versus cost, and to rapidly determine the cost impact of alterations to a configuration.

When no modifications to the geometrical parameter set of input variables are desired at query task 156, process 102 proceeds to a task 164 (discussed below). However, when modifications are desired process control loops back to task 160 to adjust one or more of the geometrical parameters and re-execute antenna screen evaluation routine 108 (FIG. 7).

Figure 10:
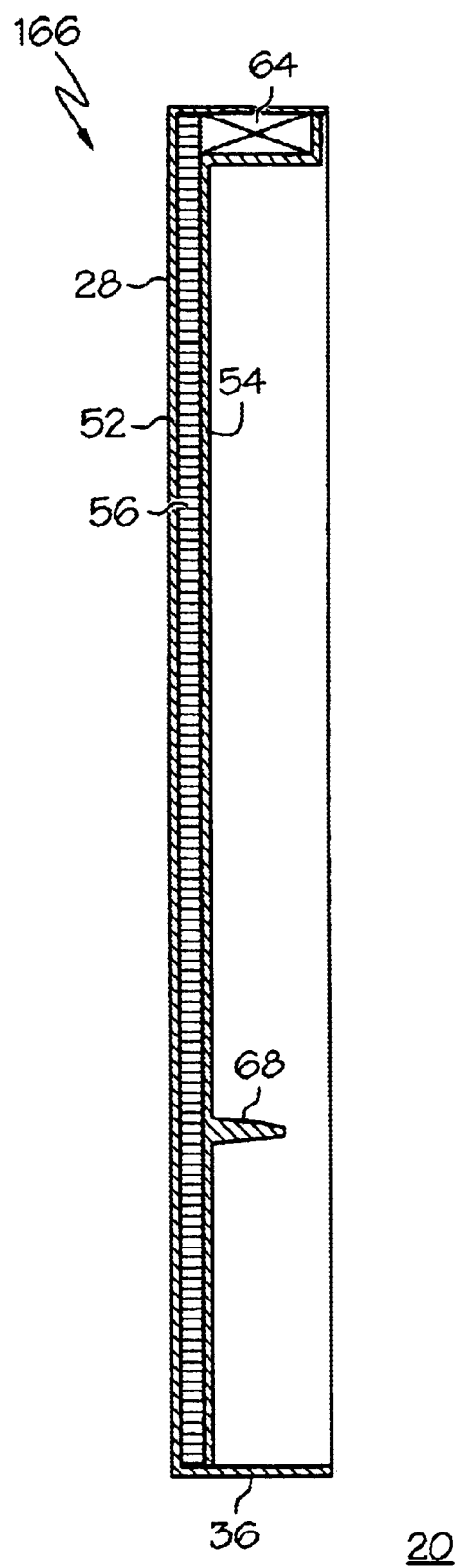
FIG. 10 shows a sectional side view of a third configuration of the antenna screen structure of FIG. 1.

FIG. 10 shows a sectional side view of a third configuration 166 of antenna screen structure 20 (FIG. 1). Third configuration 164 was formed at task 160 following an affirmative response to query 156. Third configuration 166 includes first beam member 64, second horizontal flange 36, and a horizontal intermediate support member 68. Horizontal intermediate support member 68 is in the form of a solid FRP flange and replaces second beam member 66 of second configuration 62 (FIG. 3). Like first configuration 48 (FIG. 2) and second configuration 62, screen face 28 of third configuration 166 also includes first and second FRP layers 52 and 54, respectively, and thermoplastic honeycomb layer 56.

Referring back to table 136 (FIG. 9), third configuration 166 is identified by a third identifier 167, labeled "3", in configuration identifier field 138 and deflection, weight, and cost values for third configuration 166 (FIG. 10) are summarized in table 136 in association with third identifier 167. As shown, data is summarized in upper section and beam deflection fields 146 and 150 and associated with third identifier 167. Since third configuration 166 includes only first beam member 64, lower section deflection field 148 and $D_{MAX(lower\_beam)}$ of beam deflection field 150 are not considered. In addition, a total weight of 747 lb for third configuration 166 is summarized in total weight field 142, and a total cost of $7976.00 for third configuration 166 is summarized in total cost field 144.

As shown, both $D_{MAX(upper)}$ and $D_{MAX(upper\_beam)}$ are less than their respective deflection limits, $D_{LIM(upper)}$ and $D_{LIM(beam)}$. Thus, process 102 proceeds to query task 156 to determine whether further modifications of geometrical parameters are desired. A negative response to query task 156 cause program control to proceed to task 164.

At task 164, the deflection values, total weights, and costs of each configuration of antenna screen structure 20, evaluated through execution of antenna screen evaluation routine 108, are compared. Of note in the exemplary embodiment, table 136 (FIG. 9) shows that third configuration 166, identified by third identifier 167, exhibits sufficient structural integrity at a lower weight and lower cost than second configuration 62, identified by second identifier 162.

A task 168 is performed in cooperation with task 164 to select and finalize one of the configurations of antenna screen structure 20 (FIG. 1). Since third configuration 166

(FIG. 10) exhibits sufficient structural integrity at a lower weight and lower cost than second configuration 62 (FIG. 3), the designer may opt to select third configuration 166 for antenna screen structure 20 (FIG. 1). Finalization activities associated with selection of an antenna screen structure configuration entail confirming that the existing structure of building 26 is acceptable for the size and shape of third configuration 166; producing detailed drawings of the antenna screen structure, internal structure, connections, and installation information; developing a manufacturing process, tooling and mold designs; obtaining permitting; developing a matching finish texture and color specimen; and so forth. Ellipses following task 168 represent the performance of finalization activities, not pertinent to the present invention, that take place prior to fabrication of antenna screen structure.

Following task 168, a task 170 is performed. At task 170, antenna screen structure 20 (FIG. 1) is fabricated in the selected, finalized configuration, for example, third configuration 166, to imitate the appearance of building 26 (FIG. 1) at location 24 (FIG. 1). Fabrication activities entail establishing the construction and installation schedule; securing materials; constructing molds, tooling, forms, and patterns; manufacturing antenna screen structure 20; integrating the surface finish into screen face 28; inspecting and shipping antenna screen structure 20.

The "finish" of screen face 28 can be color, texture, or both. A smooth screen face 28 may have a shallow texture. However, deeper convolutions may require the texture to be "molded-in" so that screen face 28 is formed to the profile of the material being duplicated. First FRP layer 52 may be pigmented to the final desired color of antenna screen structure 20. Alternatively, the final desired color of antenna screen structure 20 may be applied, i.e., painted onto screen face 28, following fabrication of structure 20.

Following task 170, a task 172 is performed and antenna screen structure 20 is mounted at location 24 so that antenna 22 (FIG. 1) is hidden from an observer. Following task 172, antenna concealment process 102 exits.

Antenna screen evaluation routine 108 (FIG. 8) is executed to evaluate antenna screen structure configurations having a cored construct, that include a maximum of two horizontal beam members and a horizontal flange on the lower edge of the screen face, and where the horizontal flange on a lower edge of the screen panel is attached to the structure at a location. A more detailed version of evaluation routine 108 may be employed to evaluate antenna screen structure configurations having a cored construct in both upper and lower sections 70 and 72 of screen face 28; more than two horizontal beam members; different beam member types, shapes, and materials; vertical intermediate support members, or columns, and so forth. An Appendix to this specification provides Input and Output Variables and associated Rules for the more detailed version of routine 108. Exemplary values computed during an iteration of the routine are also provided in the Input and Output Variables columns of the routine.

In summary, the present invention teaches of a method for concealing a cell site radio frequency (RF) antenna system. The concealment process entails the use of a computer-based method, in the form of an antenna screen evaluation routine, that evaluates a configuration of an antenna screen structure and rapidly assesses structural integrity, weight, and cost information. In addition, through the execution of the routine the cost and structural impact of alterations to the antenna screen structure can be readily evaluated. Furthermore, the execution of the antenna screen evaluation routine within the antenna concealment process aids a designer to balance aesthetic effectiveness, RF degradation potential, structural integrity, and cost considerations in the design, fabrication, and installation of antenna screen structures.

Although the preferred embodiments of the invention have been illustrated and described in detail, it will be readily apparent to those skilled in the art that various modifications may be made therein without departing from the spirit of the invention or from the scope of the appended claims. For example, those skilled in the art will appreciate that the present invention will accommodate a wide variation in the specific tasks and the specific task ordering used to accomplish the processes described herein.

What is claimed is:

1. A method of concealing a cell site radio frequency (RF) antenna at a location comprising:
   executing a set of instructions on a processor to evaluate a configuration of an antenna screen structure, said instructions directing said processor to perform operations comprising:
      receiving a wind load value for said location;
      obtaining structural parameters of said configuration; and
      computing a maximum deflection value of said configuration in response to geometrical parameters of said configuration, said wind load value, and said structural parameters;
   when said maximum deflection value is less than a deflection limit value, determining that said configuration of said antenna screen structure has acceptable structural integrity;
   fabricating said configuration of said antenna screen structure to imitate an appearance of a structure at said location; and
   mounting said antenna screen structure and said cell site RF antenna at said location so that said cell site RF antenna is hidden from an observer.

2. A method as claimed in claim 1 further comprising:
   ascertaining that said configuration of said antenna screen structure has unacceptable structural integrity when said maximum deflection value is greater than said deflection limit value;
   adjusting one of said geometrical parameters in response to said ascertaining operation to form a second configuration of said antenna screen structure;
   re-executing said set of instructions on said processor to evaluate said second configuration of said antenna screen structure, said instructions directing said processor to compute a second maximum deflection value of said second configuration in response to said adjusted one of said geometrical parameters, said wind load value, and said structural parameters; and
   when said second maximum deflection value is less than said deflection limit value, fabricating said second configuration of said antenna screen structure to imitate said appearance of said structure at said location; and
   mounting said antenna screen structure and said cell site RF antenna at said location so that said cell site RF antenna is hidden from an observer.

3. A method as claimed in claim 1 further comprising assessing a cost for said configuration of said antenna screen structure in response to said geometrical parameters and a plurality of pre-determined cost parameters, wherein said instructions further direct said processor to perform said assessing operation.

4. A method as claimed in claim 3 wherein said maximum deflection value is a first maximum deflection value, said deflection limit value is a first deflection limit value, and said method further comprises:

re-executing said set of instructions to compute a second maximum deflection value of a second configuration of said antenna screen structure in response to adjusted ones of said geometrical parameters and to assess a second cost of said second configuration in response to said adjusted ones of said geometrical parameters and said plurality of pre-determined cost parameters;

when said first maximum deflection value is less than said first deflection limit value and said second maximum deflection value is less than said second deflection limit value, comparing said cost and said second cost to determine a lower cost one of said first and second configurations of said antenna screen structure.

5. A computer-based method for evaluating a configuration of an antenna screen structure formed to conceal a cell site radio frequency (RF) antenna at a location, said method comprising:

defining geometrical parameters of said configuration;

receiving a wind load value for said location;

obtaining structural parameters of said configuration;

computing a maximum deflection value of said configuration in response to said geometrical parameters, said wind load value, and said structural parameters;

comparing said maximum deflection value to a deflection limit value; and determining that said configuration of said antenna screen structure has acceptable structural integrity when said maximum deflection value is less than said deflection limit value.

6. A computer-based method as claimed in claim 5 wherein said configuration is a first configuration, and said method further comprises:

ascertaining, in response to said comparing operation, that said configuration of said antenna screen structure has unacceptable structural integrity when said maximum deflection value is greater than said deflection limit value;

adjusting one of said geometrical parameters in response to said ascertaining operation to form a second configuration of said antenna screen structure;

computing a second maximum deflection value of said second configuration in response to said adjusted one of said geometrical parameters, said wind load value, and said structural parameters; and determining that said second configuration of said antenna screen structure has acceptable structural integrity when said second maximum deflection value is less than said deflection limit value.

7. A computer-based method as claimed in claim 6 wherein said one of said geometrical parameters is a thickness of a screen face of said antenna screen structure, and said adjusting operation comprises modifying said thickness.

8. A computer-based method as claimed in claim 6 wherein said one of said geometrical parameters is a stiffness element of a screen face of said antenna screen structure, and said adjusting operation comprises modifying said stiffness element.

9. A computer-based method as claimed in claim 6 wherein said one of said geometrical parameters is a peripheral support member of said antenna screen structure, and said adjusting operation comprises modifying said peripheral support member.

10. A computer-based method as claimed in claim 6 wherein said one of said geometrical parameters is an intermediate support member of said antenna screen structure, and said adjusting operation comprises modifying said intermediate support member.

11. A computer-based method as claimed in claim 5 wherein said configuration of said antenna screen structure includes a screen face and a beam member directed along a horizontal width of said screen face, said obtaining operation comprises:

receiving a first one of said structural parameters for said screen face, said first structural parameter being a first allowable deflection ratio; and receiving a second one of said structural parameters for said beam member, said second structural parameter being a second allowable deflection ratio.

12. A computer-based method as claimed in claim 5 wherein said configuration of said antenna screen structure includes a screen face, and said obtaining operation comprises receiving a modulus of elasticity for said screen face.

13. A computer-based method as claimed in claim 5 wherein said configuration of said antenna screen structure includes a screen face and a beam member directed along a horizontal width of said screen face, and said obtaining operation comprises determining a modulus of elasticity for said beam member in response to a composition of said beam member.

14. A computer-based method as claimed in claim 5 wherein said receiving operation comprises:

accepting at least one of an importance factor multiplier, an elevation factor multiplier, and a site coefficient multiplier;

combining said at least one of said importance factor multiplier, said elevation factor multiplier, and said site coefficient multiplier with a baseline wind load value for said location to produce said wind load value.

15. A computer-based method as claimed in claim 5 wherein:

said configuration of said antenna screen structure includes a screen face and a beam member directed along a horizontal width of said screen face;

said deflection limit value is a deflection limit of said screen face;

said maximum deflection value is a deflection value for said screen face;

said computer-based method further comprises:
      computing a beam member maximum deflection value of said configuration; and
      comparing said beam member maximum deflection value to a beam member deflection limit value; and said determining operation further comprises determining that said antenna screen structure has acceptable structural integrity when said maximum deflection value is less than said deflection limit value and said beam member maximum deflection value is less than said beam member deflection limit value.

16. A computer-based method as claimed in claim 5 further comprising assessing a cost for said configuration of said antenna screen structure in response to said geometrical parameters and a plurality of pre-determined cost parameters, said assessing operation occurring concurrent with said computing operation.

17. A computer-based method as claimed in claim 16 further comprising:

receiving an altered one of said pre-determined cost parameters; and performing, in response to said altered one of said pre-determined cost parameters, said assessing operation to determine a revised cost for said configuration of said antenna screen structure.

18. A computer-based method as claimed in claim 16 wherein said configuration is a first configuration, and said method further comprises:

adjusting one of said geometrical parameters to form a second configuration of said antenna screen structure;

computing a second maximum deflection value of said second configuration in response to said adjusted one of said geometrical parameters, said wind load value, and said structural parameters ;

determining that said second configuration of said antenna screen structure has acceptable structural integrity when said second maximum deflection value is less than said deflection limit value;

assessing a second cost for said second configuration of said antenna screen structure in response to said adjusted one of geometrical parameters and said plurality of pre-determined cost parameters; and comparing said cost and said second cost to determine a lower cost one of said first and second configurations of said antenna screen structure.

19. A computer-based method as claimed in claim 5 further comprising estimating a total weight for said configuration of said antenna screen structure in response to said geometrical parameters and a plurality of pre-determined weight parameters, said estimating operation occurring concurrent with said computing operation.

20. A computer-readable storage medium containing executable code for instructing a processor to evaluate a configuration of an antenna screen structure formed to conceal a cell site radio frequency (RF) antenna, said executable code instructing said processor to perform operations comprising:

defining geometrical parameters of said configuration;

receiving a wind load value for said location;

obtaining structural parameters of said configuration;

computing a maximum deflection value of said configuration in response to said geometrical parameters, said wind load value, and said structural parameters;

estimating a total weight for said configuration of said antenna screen structure in response to said geometrical parameters and a plurality of pre-determined weight parameters;

assessing a cost for said configuration of said antenna screen structure in response to said geometrical parameters and a plurality of pre-determined cost parameters, said estimating and assessing operations occurring concurrent with said computing operation; and comparing said maximum deflection value to a deflection limit value to determine whether said configuration of said antenna screen structure has acceptable structural integrity, said configuration having said acceptable structural integrity when said maximum deflection value is less than said deflection limit value.

21. A computer-readable storage medium as claimed in claim 20 wherein said configuration is a first configuration, and said executable code further instructs said processor to perform operations comprising:

adjusting one of said geometrical parameters to form a second configuration of said antenna screen structure;

computing a second maximum deflection value of said second configuration in response to said adjusted one of said geometrical parameters, said wind load value, and said structural parameters;

estimating a second total weight for said second configuration of said antenna screen structure in response to said adjusted one of said geometrical parameters and said pre-determined weight parameters;

assessing a second cost for said second configuration of said antenna screen structure in response to said adjusted one of said geometrical parameters and said plurality of pre-determined cost parameters; and comparing said second maximum deflection value to said deflection limit value to determine whether said second configuration of said antenna screen structure has said acceptable structural integrity, said second configuration having said acceptable structure integrity when said second maximum deflection value is less than said deflection limit value.

22. A computer-readable storage medium as claimed in claim 21 wherein said executable code further instructs said processor to perform a further operation comprising comparing said cost and said second cost to determine a lower cost one of said first and second configurations of said antenna screen structure.

\* \* \* \* \*

UNITED STATES PATENT AND TRADEMARK OFFICE
CERTIFICATE OF CORRECTION

PATENT NO. : 6,697,689 B2  
DATED : February 24, 2004  
INVENTOR(S) : Brent W. Lendriet It is certified that error appears in the above-identified patent and that said Letters Patent is hereby corrected as shown below:

Column 12,  
Line 23, insert the table

Input Variables (Pre-determined Weight Parameters)

| | |
|---|---|
| core_wt | Weight of thermoplastic honeycomb layer 56 per square foot, lb/ft$^2$ |
| FRP_density | Density of fiberglass-reinforced plastic, lb/ft$^3$ |
| BM1_lam_thk | BM1 FRP laminate thickness, inches |
| BM1_lam_thk | BM2 FRP laminate thickness, inches |
| Finish_thk | Thickness of applied finish, inches | after the word "Exemplary pre-determined weight parameters are as follows:" and delete the table:

Input Variables (Pre-determined Cost Parameters)

| | |
|---|---|
| FR_adder | Adder for FR resin, $/lb |
| FRP_top_skin_cst_lb | Cost per pound for first and second FRP layers 52 and 54, $/lb |
| core_cost_ft | Cost of thermoplastic honeycomb layer 56, $/ft$^2$ |
| core_bond_cost_ft | Cost to bond first and second FRP layers 52 and 54 to thermoplastic honeycomb layer 56, $/ft$^2$ |
| beam_lam | Cost to laminate beams, $/lb |
| steel_cst_lb | Cost for steel beam members, $/lb |
| wood_cst_lb | Cost for wood beams, $/lb |
| stl_add | "Adder" for EACH steel beam fab cost, $ |
| wd_add | "Adder" for EACH wood beam fab cost, $ |
| C_flg_cst_lb | Cost to fabricate first and second vertical flanges 40 and 44, $/lb |
| P_flg_cst_lb | Cost to fabricate first and second horizontal flanges 32 and 36, $/lb |
| Finish_cost | Cost of texture finish, $/ft$^2$ |
| DETAILcost | DETAILING costs, $/ft$^2$ |
| DEScost | Design Cost, $ |
| MOLDcost | Mold costs, $ |
| SHIPcost | Shipping/packaging costs, $ |
| OTHERcosts | Other costs, $ |
| NUM_corners | Quantity of field-joints |
| corner_adder | Adder for field-joint corner accommodations, $ --. |

UNITED STATES PATENT AND TRADEMARK OFFICE
CERTIFICATE OF CORRECTION

PATENT NO. : 6,697,689 B2
DATED : February 24, 2004
INVENTOR(S) : Brent W. Lendriet It is certified that error appears in the above-identified patent and that said Letters Patent is hereby corrected as shown below:

Column 12 (cont'd),
Line 51, insert the table:

| | Input Variables (Pre-determined Cost Parameters) |
|---|---|
| FR_adder | Adder for FR resin, $/lb |
| FRP_top_skin_cst_lb | Cost per pound for first and second FRP layers 52 and 54, $/lb |
| core_cost_ft | Cost of thermoplastic honeycomb layer 56, $/ft² |
| core_bond_cost_ft | Cost to bond first and second FRP layers 52 and 54 to thermoplastic honeycomb layer 56, $/ft² |
| beam_lam | Cost to laminate beams, $/lb |
| steel_cst_lb | Cost for steel beam members, $/lb |
| wood_cst_lb | Cost for wood beams, $/lb |
| stl_add | "Adder" for EACH steel beam fab cost, $ |
| wd_add | "Adder" for EACH wood beam fab cost, $ |
| C_flg_cst_lb | Cost to fabricate first and second vertical flanges 40 and 44, $/lb |
| P_flg_cst_lb | Cost to fabricate first and second horizontal flanges 32 and 36, $/lb |
| Finish_cost | Cost of texture finish, $/ft² |
| DETAILcost | DETAILING costs, $/ft² |
| DEScost | Design Cost, $ |
| MOLDcost | Mold costs, $ |
| SHIPcost | Shipping/packaging costs, $ |
| OTHERcosts | Other costs, $ |
| NUM_corners | Quantity of field-joints |
| corner_adder | Adder for field-joint corner accommodations, $ | after the word "Exemplary pre-determined cost parameters are as follows:" and delete the table:

| | Input Variables (Pre-determined Weight Parameters) |
|---|---|
| core_wt | Weight of thermoplastic honeycomb layer 56 per square foot, lb/ft² |
| FRP_density | Density of fiberglass-reinforced plastic, lb/ft³ |
| BM1_lam_thk | BM1 FRP laminate thickness, inches |
| BM1_lam_thk | BM2 FRP laminate thickness, inches |
| Finish_thk | Thickness of applied finish, inches --. |

UNITED STATES PATENT AND TRADEMARK OFFICE
CERTIFICATE OF CORRECTION

PATENT NO.   : 6,697,689 B2
DATED        : February 24, 2004
INVENTOR(S)  : Brent W. Lendriet It is certified that error appears in the above-identified patent and that said Letters Patent is hereby corrected as shown below:

Column 20,
Line 14, insert:

APPENDIX

Antenna screen structure evaluation routine for an antenna screen structure exhibiting a multiple composition configuration of a cored upper section and a cored lower section, different beam types, shapes & materials, including horizontal beam members, and end flanges or end columns is as follows:

VARIABLES SHEET

| Status | Input Value | Variable Name | Output Value | Unit | Comment |
|---|---|---|---|---|---|
| | | TOT_cost | 3024 | $ | Total cost of antenna screen structure configuration |
| | | | | | CELL-SITE ANTENNA SCREEN STRUCTURE, DESIGN CALCULATION VALUES, AND COST ELEMENTS |
| | | | | | INPUT VARIABLES FOR CONFIGURATION (Geometrical Parameters) |
| | 144 | Z | | in | Panel total elevation, height (screen face) |
| | 72 | X | | in | Upper section elevation (cored face), height |
| | | Y | 54 | in | Lower section elevation (solid face), height |
| | 18 | C | | in | Proj. column above roof B-4 panel |
| | 144 | A | | in | Panel segment span horizontally, width |

| | | | | | |
|---|---|---|---|---|---|
| | | | | | [beam 3 is not the lowermost! it is] |
| | | | | | [the series of identical mid-beams] |
| | 1 | BM3 | | | Beam 3 type (1 for hollow rect, 0 solid |
| | 3 | i3b | | | OD width of beam 3 (perpendicular to screen) |
| | 3 | i3d | | | OD height of beam 3(parallel to screen) |
| | 2.75 | i3b1 | | | ID width used on hollow tubes |
| | 2.75 | i3d1 | | | ID height used on hollow tubes |
| | | | | | Always the lowermost when >2 beams used |
| | 1 | BM4 | | | Beam 4 type (1 for hollow rect, 0 solid |
| | 3 | i4b | | | OD width of beam 4(perpendicular to screen) |
| | 3 | i4d | | | OD height of beam 4(parallel to screen) |
| | 2.75 | i4b1 | | | ID width used on hollow tubes |
| | 2.75 | i4d1 | | | ID height used on hollow tubes |
| | | | | | ENTER "0" IF THIS BEAM NOT USED |
| | 0.25 | BM1_lam_thk | | | Beam 1 laminate thickness |
| | 0.25 | BM2_lam_thk | | | Beam 2 laminate thickness (always 2nd) |
| | 0.25 | BM3_lam_thk | | | Beam 3 laminate thickness(all other mid) |
| | 0.25 | BM4__lam_thk | | | Beam 4 laminate thickness (always lowest if −2) |
| | | | | | (Note: thickness is added to wood beams for I^4 calculations) |

UNITED STATES PATENT AND TRADEMARK OFFICE
CERTIFICATE OF CORRECTION

PATENT NO.    : 6,697,689 B2
DATED         : February 24, 2004
INVENTOR(S)   : Brent W. Lendriet It is certified that error appears in the above-identified patent and that said Letters Patent is hereby corrected as shown below:

Column 20 (cont'd),

| | | | | | | STRUCTURAL CONCLUSIONS |
|---|---|---|---|---|---|---|
| | | Dlimit2 | 0.4 | | in | DEFLECTION LIMIT OF UPPER SECTION |
| | | DEFplate | 0.287 | | in | Plate deflection @ center- upper section |
| | | Dlimit3 | 0.23 | | in | DEFLECTION LIMIT OF LOWER SECTION |
| | | DEFplate1 | 0.65 | | in | Plate deflection @ center- lower sections |
| | | Dlimit1 | 0.6 | | in | DEFLECTION LIMIT OF BEAM MEMBERS |
| | | DEFbm1 | 0.19 | | | Deflection of uppermost beam |
| | | DEFbm2 | 0.26 | | | Deflection of 2nd beam down |
| | | DEFbm3 | 0.17 | | | Deflection of mid-beams 3 |
| | | DEFbm4 | 0.08 | | | Deflection of lower beam 4 |
| | | | | | | BEAM MOMENT OF INERTIA (set to "in" and change sizes to "out") |
| | | I1 | 31.5 | | in^4 | I^4 of uppermost beam |
| | | I2 | 31.5 | | in^4 | I^4 of 2nd beam down |
| | | I3 | 1.984 | | in^4 | I^4 of mid-beams |
| | | I4 | 1.984 | | in^4 | I^4 of bottom beam |
| | | | | | | OUTPUT STRUCTURAL VALUES, FACES |
| | | A | 0.028 | | # | Alpha per Roark-upper face sections |
| | | A1 | 0.028 | | # | Alpha per Roark-lower face sections |
| | | Atotal | 126 | | ft^2 | TOTAL surface area |
| | | wtot | 20.22 | | lbs | Load in pounds per inch-length (q*z) |
| | | wtot1 | 5.78 | | lbs/in | Load on uppermost beam (q*x)/2 |
| | | wtot2 | 7.95 | | lbs/in | Load on second beam |
| | | wtot3 | 4.33 | | lbs/in | Load on all mid beams (3rd and more) |
| | | wtot4 | 2.17 | | lbs/in | Load on bottom beam |
| | | | | | | WEIGHT CONCLUSIONS |
| | | Panel_WT | 864 | | lbs | Prox weight of panel assembly |
| | 0.08 | Finish_thk | | | in | Applied finish thickness |
| | | Finsh_wt | 94 | | lbs | Weight of finish texture |
| | | | | | | PRE-DETERMINED COST PARAMETERS |
| | 1.0 | FRP_top_skin_cst_lb | | | $/lb | Cost per pound for upper FRP skins |
| | 1.0 | FRP_bot_skin_cst_lb | | | $/lb | Cost per pound for lower FRP face |
| | 1.0 | core_cost_ft | | | $ | Core cost per square foot |
| | 1.5 | Core_bond_cost_ft | | | $ | Cost per sq ft to bond core |
| | 2.0 | beam_lam_cost_lb | | | $/lb | Cost per pound to laminate beams |
| | .5 | steel_cst_lb | | | $/lb | Cost per pound for steel beams |
| | .7 | wood_cst_lb | | | $/lb | Cost per pound for wood beams |
| | 25 | stl_add | | | $ | Adder for EACH steel beam fab costs |
| | 25 | wd_add | | | $ | Adder for EACH wood beam fab costs |
| | 5 | COLcost_ft | | | $/ft | Cost to fab end columns per lin foot |
| | 3 | col_lam_cost_lb | | | $/lb | Cost per pound for column laminating |
| | 3.5 | C_flg_cst_lb | | | $/lb | Cost per pound to fab corner flanges |
| | 4.5 | P_flg_cst_lb | | | $/lb | Cost per pound to fab Horizontal flanges |
| | 2.2 | finish_cost | | | $/ft^2 | Cost of texture finish per sq foot |
| | .8 | DETAILcost | | | $/ft^2 | DETAILING costs PER SQUARE FOOT |
| | 100 | DEScost | | | | Design cost |
| | 150 | MOLDcost | | | | MOLD costs |
| | 250 | SHIPcost | | | | SHIPPING-PACKAGING costs |
| | 0 | OTHERcost | | | | OTHER costs |

UNITED STATES PATENT AND TRADEMARK OFFICE
CERTIFICATE OF CORRECTION

PATENT NO.    : 6,697,689 B2
DATED         : February 24, 2004
INVENTOR(S)   : Brent W. Lendriet It is certified that error appears in the above-identified patent and that said Letters Patent is hereby corrected as shown below:

Column 20 (cont'd),

| | | | | | |
|---|---|---|---|---|---|
| | 75 | corner_adder | | | Adder for field corner accommodations (Must also enter "NUM CORNER" field |
| | | | | | Output Variables field for costs |
| | | COLfrp_cost | 0 | | Cost to apply frp to columns total |
| | | tot_core_cost | 280 | | Total coring costs (included in below) |
| | | | | | COST CONCLUSIONS |
| | | FACEcost | 477 | $ | Cost to mold face |
| | | TOT_BM_cst | 209 | $ | Total cost to supply beams |
| | | BEAMfrp_cost | 370 | $ | Cost to apply FRP to beams total |
| | | COL_tot_cost | 0 | $ | Cost for primary columns |
| | | FINISHcost | 557 | $ | Cost to finish face |
| | | DETAIL_totcost | 101 | $ | Cost for detail work |
| | | C_flg_tot | 463 | $ | Total cost of corner flanges & setup |
| | | P_flg_tot | 196 | $ | Total cost of horizontal flanges & setup |
| | | MISCcost | 500 | $ | TOTAL MISC. COSTS(design, mold, shipping |
| | | COST_foot | 24 | $/ft | Cost per foot, for comparison |
| | | | | | MISC. OUTPUT VARIABLES (Weight Conclusions) |
| | | BM1_wt | 36 | lbs | Weight of beam element #1 |
| | | BM2_wt | 36 | lbs | Weight of beam element #2 |
| | | BM3_wt | 59 | lbs | Weight of beam element #3 |
| | | BM4_wt | 59 | lbs | Weight of beam element #4 |
| | | TOT_BM_wt | 189 | lbs | TOTAL WEIGHT OF ALL BEAM ELEMENTS |
| | | P | 1456 | lbs | Total distributed load each end columns |
| | | p | 11.56 | lbs | Loading per in vert. on end columns |
| | | V | 327.64 | lbs | Equivalent concentrated load mid-span of z |
| | | | | | Beam bonding laminate weights |
| | | BM1_lam_wt | 43 | lbs | Beam 1 laminate weight |
| | | BM2_lam_wt | 43 | lbs | Beam 2 laminate weight |
| | | BM3_lam_wt | 49 | lbs | Beam 3 laminate weight |
| | | BM4_lam_wt | 49 | lbs | Beam 4 laminate weight |
| | | TOT_BM_lam_wt | 185 | lbs | TOTAL BEAM BONDING LAMINATE WEIGHT |
| | | COLtotM | 0 | ft | Column core Metal length total |
| | | COL_WT_M | 0 | lbs | Column core Metal weight |
| | | COLtotW | 0 | ft | Column core Wood length total |
| | | COL_WT_W | 0 | lbs | Column core WOOD weight |
| | | COL_TOT_wt | 0 | lbs | Total weight all column cores |
| | | COL_M_frpWT | 0 | lbs | Column Metal laminate weight |
| | | COL_W_frpWT | 0 | lbs | Column Wood laminate weight |
| | | COL_FRP_TOT_WT | 0 | lbs | Total column laminate weight |
| | | Top_FRP_wt | 121 | lbs | Upper FRP weight |
| | | Bot_FRP_wt | 76 | lbs | Lower FRP weight |
| | | COL_wt | 0 | lbs | Total weight of columns and laminate |
| | | Face_wt | 197 | lbs | Total weight of complete face |

UNITED STATES PATENT AND TRADEMARK OFFICE
CERTIFICATE OF CORRECTION

PATENT NO. : 6,697,689 B2
DATED : February 24, 2004
INVENTOR(S) : Brent W. Lendriet It is certified that error appears in the above-identified patent and that said Letters Patent is hereby corrected as shown below:

Column 20 (cont'd),

| | | | | | |
|---|---|---|---|---|---|
| | | Beam_wt | 374 | lbs | Total weight of beams and laminate |
| | | C_flg_wt | 57 | lbs | Corner flange weight |
| | | P_flg_wt | 21 | lbs | Horizontal flange weight |
| | | | | | MISC. OUTPUT VARIABLES (Weight Conclusions) |
| | | BM_cst1 | 50 | $ | Cost for beam 1 |
| | | BM_cst2 | 50 | $ | Cost for beam 2 |
| | | BM_cst3 | 54 | $ | Cost for beam 3 |
| | | BM_cst4 | 54 | $ | Cost for beam 4 |
| | | Field_corner_cst | 150 | $ | Field corner total cost per screen |
| | | a1 | 144 | in | screen width (alternate variable input) |
| | | b | 72 | in | (same as "x" upper screen height) |
| | | Top_face_cst | 121 | $ | Upper face cost |
| | | Bot_face_cst | 76 | $ | Lower face cost |
| | | C_flg_cost | 199 | $ | Corner Flange cost |
| | | C_flg_setup | 264 | $ | Corner flange set-up cost |
| | | COL_cost | 0 | $ | Column cost-raw materials |
| | | COL_cost_ft | 0 | $ | Reflects "Column cost per foot" total |
| | | P_flg_cost | 96 | $ | Horizontal flange cost |
| | | P_flg_setup | 100 | $ | Horizontal flange setup cost |

RULES SHEET

| Status | Rule |
|---|---|
| Comment | ;RULE SHEET FOR COMBINATION SCREEN FACE COMPOSITIONS (cored and/or plate); |
| Comment | ;Using horizontal beams of tube steel or wood core, with beams surrounding; |
| Comment | ;the core or upper section, and horizontal girts spaced closely on the balance; |
| Comment | ;the end COLUMNS are mitered plate; |
| Comment | ;BASIC GEOMETRY OF SCREEN; |
| Satisfied | a=a1 ;horizontal span of screen, upper & lower; |
| Satisfied | t=((skin t*2)+core t) ;TOTAL Thickness of upper face section; |
| Satisfied | y=((z-c)-x) ;elevations: z=total;x=upper section;y=lower section;c=standoff |
| Satisfied | IF NUM_Hbeams>2 THEN b1=(y/((ABS(NUM_Hbeams))-2)) ELSE b1=1;Horizontal spacing between lower sections |
| Satisfied | IF NUM_Hbeams>2 THEN NUM_MIDbeams=(ABS(NUM_Hbeams-2)) ELSE NUM_MIDbeams=0;quantity of mid-beams |
| Satisfied | b=x;is the upper section vertical distance (cored plate height); |
| Comment | ;STRUCTURE OF SCREEN; |
| Comment | ;WIND LOADING VALUES; |
| Satisfied | psf=(psf BASE*I_factor*E_factor*SITE_factor) |
| Satisfied | q=(psf/144) ;Loading in psi |
| Satisfied | DEFplate=((A*q*x^4)/(E1*t^3)) |
| Satisfied | DEFplate1=((A1*q*b1^4)/(E2*t1^3)) |
| Comment | ;DEFLECTION LIMITS; |
| Satisfied | Dlimit1=(a/L1);deflection limits, horizontal beams; |
| Satisfied | Dlimit2=(b/L2);deflection limits, upper plate; |

UNITED STATES PATENT AND TRADEMARK OFFICE
CERTIFICATE OF CORRECTION

PATENT NO. : 6,697,689 B2
DATED : February 24, 2004
INVENTOR(S) : Brent W. Lendriet It is certified that error appears in the above-identified patent and that said Letters Patent is hereby corrected as shown below:

Column 20 (cont'd),

| | |
|---|---|
| Satisfied | Dlimit3=(b1/L3);deflection limits, lower plate; |
| Comment | ;LOADINGS APPLIED TO BEAMS; |
| Satisfied | wtot=(q*(x+y)) ;psi* total height--Loading in lbs/inch, along Horizontal; |
| Satisfied | wtot1=((q*x)/2) ;load per inch to uppermost beam; |
| Satisfied | wtot2=(wtot1+wtot4) ;load per inch to 2nd beam from top (junction of core-plate); |
| Satisfied | IF NUM_Hbeams>3 THEN wtot3=(b1*q) ELSE wtot3=0 |
| Satisfied | IF NUM_Hbeams>2 THEN wtot4=((b1*q/2)) ELSE wtot4=0 |
| Comment | ;wtot4=(ABS((b1*q)/2)) |
| Comment | ;BEAM DEFLECTIONS; |
| Satisfied | IF BM1=1 THEN E_BM1=2.9E7 ELSE E_BM1=2.2E6 |
| Satisfied | IF BM2=1 THEN E_BM2=2.9E7 ELSE E_BM2=2.2E6 |
| Satisfied | IF BM3=1 THEN E_BM3=2.9E7 ELSE E_BM3=2.2E6 |
| Satisfied | IF BM4=1 THEN E_BM4=2.9E7 ELSE E_BM4=2.2E6 |
| Satisfied | DEFbm1=((2*wtot1*a^4)/(384*E_BM1*I1)) |
| Satisfied | DEFbm2=((2*wtot2*a^4)/(384*E_BM2*I2)) |
| Satisfied | IF NUM_Hbeams>3 THEN DEFbm3=((2*wtot3*a^4)/(384*E_BM3*I3)) ELSE DEFbm3=0 |
| Satisfied | IF NUM_Hbeams>2 THEN DEFbm4=((2*wtot4*a^4)/(384*E_BM4*I4)) ELSE DEFbm4=0 |
| Comment | ;END COLUMN LOADING' |
| Satisfied | p=(.5*a*q) ;Loading per inch vertically on end columns |
| Satisfied | P=(p*(x+y)) |
| Satisfied | P=((8*V*((.5*z)+c))I(z+c)) |
| Comment | ;COMPONENT WEIGHTS; |
| Comment | ;BEAMS; |
| Satisfied | IF BM1=1 THEN BM1_wt=(((i1b*i1d)-(i1b1*i1d1))*a*.284) ELSE BM1_wt=(i1b*i1d*a*.03) |
| Satisfied | IF BM2=1 THEN BM2_wt=(((i2b*i2d)-(i2b1*i2d1))*a*.284) ELSE BM2_wt=(i2b*i2d*a*.03) |
| Satisfied | IF BM3=1 THEN BM3_wt=(((i3b*i3d)-(i3b1*i3d1))*a*.284) ELSE BM3_wt=(i3b*i3d*a*.03) |
| Satisfied | IF BM4=1 THEN BM4_wt=(((i4b*i4d)-(i4b1*i4d1))*a*.284) ELSE BM4_wt=(i4b*i4d*a*.03) |
| * Ignored | IF NUM_Hbeams=0 THEN TOT_BM_wt=0 |
| * Ignored | IF NUM_Hbeams=1 THEN TOT_BM_wt=BM1_wt |
| * Ignored | IF NUM_Hbeams=2 THEN TOT_BM_wt=(BM1_wt+BM2_wt) |
| * Ignored | IF NUM_Hbeams=3 THEN TOT_BM_wt=(BM1_wt+BM2_wt+BM4_wt) |
| Satisfied | IF NUM_Hbeams=4 THEN TOT_BM_wt=(BM1_wt+BM2_wt+BM3_wt+BM4_wt) |
| * Ignored | IF NUM_Hbeams=5 THEN TOT_BM_wt=(BM1_wt+BM2_wt+(2*BM3_wt)+BM4_wt) |
| * Ignored | IF NUM_Hbeams=6 THEN TOT_BM_wt=(BM1_wt+BM2_wt+(3*BM3_wt)+BM4_wt) |
| * Ignored | IF NUM_Hbeams=7 THEN TOT_BM_wt=(BM1_wt+BM2_wt+(4*BM3_wt)+BM4_wt) |
| Comment | ;BEAM BONDING LAMINATES; |
| Satisfied | BM1_lam_wt=((((2*i1b)+(5*I1d))*BM1_lam_thk*FRP_density)*a) |
| Satisfied | BM2_lam_wt=((((2*i2b)+(5*I2d))*BM2_lam_thk*FRP_density)*a) |
| Satisfied | BM3_lam_wt=((((2*i3b)+(5*I3d))*BM3_lam_thk*FRP_density)*a) |
| Satisfied | BM4_lam_wt=((((2*i4b)+(5*I4d))*BM4_lam_thk*FRP_density)*a) |
| * Ignored | IF NUM_Hbeams=0 THEN TOT_BM_lam_wt=0 |
| * Ignored | IF NUM_Hbeams=1 THEN TOT_BM_lam_wt=(BM1_lam_wt) |
| * Ignored | IF NUM_Hbeams=2 THEN TOT_BM_lam_wt=(BM1_lam_wt+BM2_lam_wt) |
| * Ignored | IF NUM_Hbeams=3 THEN TOT_BM_lam_wt=(BM1_lam_wt+BM2_lam_wt+BM4_lam_wt) |
| Satisfied | IF NUM_Hbeams=4 THEN TOT_BM_lam_wt=(BM1_lam_wt+BM2_lam_wt+BM3_lam_wt+BM4_lam_wt) |
| * Ignored | IF NUM_Hbeams=5 THEN TOT_BM_lam_wt=(BM1_lam_wt+BM2_lam_wt+(2*BM3_lam_wt)+BM4_lam_wt) |
| * Ignored | IF NUM_Hbeams=6 THEN TOT_BM_lam_wt=(BM1_lam_wt+BM2_lam_wt+(3*BM3_lam_wt)+BM4_lam_wt) |
| * Ignored | IF NUM_Hbeams=7 THEN TOT_BM_lam_wt=(BM1_lam_wt+BM2_lam_wt+(4*BM3_lam_wt)+BM4_lam_wt) |
| Satisfied | IF NUM_Hbeams=0 THEN Beam_wt=0 ELSE Beam_wt=(TOT_BM_wt+TOT_BM_lam_wt) |
| Comment | ;CORNER POST SIZE & WEIGHTS; |
| Satisfied | COLtotW=((x/12)*NUM_cols);length of support columns at upper section; |

UNITED STATES PATENT AND TRADEMARK OFFICE
CERTIFICATE OF CORRECTION

PATENT NO. : 6,697,689 B2  
DATED : February 24, 2004  
INVENTOR(S) : Brent W. Lendriet Page 8 of 9

It is certified that error appears in the above-identified patent and that said Letters Patent is hereby corrected as shown below:

Column 20 (cont'd),

| | |
|---|---|
| Satisfied | P_flg_wt=(P_flg_wide*a*Num_P_flg*P_flg_thk*FRP_density) |
| Satisfied | P_flg_cost=(P_flg_wt*P_flg_cst_lb) |
| Satisfied | P_flg_tot=(P_flg_cost+P_flg_setup) |
| Satisfied | IF P_flg_cost>0 THEN P_flg_setup=((((a/12)*5)+40)*Num_P_flg) ELSE P_flg_setup=0 |
| Comment | ;COST TO FABRICATE BEAM STRUCTURE; |
| Satisfied | IF BM1=1 THEN BM_cst1=((BM1_wt*steel_cst_lb)+stl_add) ELSE BM_cst1=(BM1_wt*wood_cst_lb)+wd_add |
| Satisfied | IF BM2=1 THEN BM_cst2=((BM2_wt*steel_cst_lb)+stl_add) ELSE BM_cst2=(BM2_wt*wood_cst_lb)+wd_add |
| Satisfied | IF BM3=1 THEN BM_cst3=((BM3_wt*steel_cst_lb)+stl_add) ELSE BM_cst3=(BM3_wt*wood_cst_lb)+wd_add |
| Satisfied | IF BM4=1 THEN BM_cst4=((BM4_wt*steel_cst_lb)+stl_add) ELSE BM_cst4=(BM4_wt_wood_cst_lb)+wd_add |
| Ignored | IF NUM_Hbeams=0 THEN TOT_BM_cst=0 |
| Ignored | IF NUM_Hbeams=2 THEN TOT_BM_cst=(BM_cst1+BM_cst2) |
| Ignored | IF NUM_Hbeams=3 THEN TOT_BM_cst=(BM_cst1+BM_cst2+BM_cst4) |
| Satisfied | IF NUM_Hbeams=4 THEN TOT_BM_cst=(BM_cst1+BM_cst2+BM_cst3+BM_cst4) |
| Ignored | IF NUM_Hbeams=5 THEN TOT_BM_cst=(BM_cst1+BM_cst2+(2*BM_cst3)+BM_cst4) |
| Ignored | IF NUM_Hbeams=6 THEN TOT_BM_cst=(BM_cst1+BM_cst2+(3*BM_cst3)+BM_cst4) |
| Ignored | IF NUM_Hbeams=7 THEN TOT_BM_cst=(BM_cst1+BM_cst2+(4*BM_cst3)+BM_cst4) |
| Satisfied | IF NUM_Hbeams=0 THEN BEAMfrp_cost=0 ELSE BEAMfrp_cost=(beam_lam_cost_lb*TOT_BM_lam_wt) |
| Comment | ;COST TO FABRICATE END COLUMNS; |
| Satisfied | COLfrp_cost=(col_lam_cost_lb*COL_FRP_TOT_WT) |
| Satisfied | COL_cost1=((COL_WT_M*steel_cst_lb)+(COL_WT_W*wood_cst_lb)) |
| Satisfied | COL_cost2=((((z+c)/12)*NUM_cols)*COLcost_ft) |
| Satisfied | COL_tot_cost=((COLfrp_cost)+(COL_cost1)+COL_cost2) |
| Satisfied | FINISHcost=(140+(Atotal*finish_cost_ft)+(Finsh_wt*1.5)) |
| Satisfied | DETAIL_totcost=(Atotal*DETAILcost);adder for detailing cost per square foot; |
| Satisfied | MISCcost=(DEScost+MOLDcost+SHIPcost+OTHERcost);required misc costs; |
| Satisfied | Field_corner_cst=(NUM_corners*corner_adder) |
| Satisfied | TOT_cost=(FACEcost+BEAMfrp_cost+TOT_BM_cst+COL_tot_cost+FINISHcost+ DETAIL_totcost+MISCcost+C_flg_tot+P_flg_tot+Field_corner_cst |
| Satisfied | COST_foot=(TOT_cost/Atotal) |
| Comment | ;ALPHA VALUES;case 1, upper screen section cored; |
| Ignored | IF and ((a/b)>0, (a/b)<=1.1) THEN A=.0138 |
| Ignored | IF and ((a/b)>1.1, (a/b)<=1.3) THEN A=.0188 |
| Ignored | IF and ((a/b)>1.3, (a/b)<=1.5) THEN A=.0226 |
| Ignored | IF and ((a/b)>1.5, (a/b)<=1.7) THEN A=.0251 |
| Ignored | IF and ((a/b)>1.7, (a/b)<=1.9) THEN A=.0267 |
| Satisfied | IF and ((a/b)>1.9, (a/b)<=2.1) THEN A=.0277 |
| Ignored | IF and ((a/b)>2.1, (a/b)<=20) THEN A=.0284 |
| Comment | ;ALPHA VALUES;case 2, lower plate section; |
| Ignored | IF and ((a1/b1)>0, (a1/b1)<=1.1) THEN A1=.0138 |
| Ignored | IF and ((a1/b1)>1.1, (a1/b1)<=1.3) THEN A1=.0188 |
| Ignored | IF and ((a1/b1)>1.3, (a1/b1)<=1.5) THEN A1=.0226 |
| Ignored | IF and ((a1/b1)>1.5, (a1/b1)<=1.7) THEN A1=.0251 |
| Ignored | IF and ((a1/b1)>1.7, (a1/b1)<=1.9) THEN A1=.0267 |
| Ignored | IF and ((a1/b1)>1.9, (a1/b1)<=2.1) THEN A1=.0277 |
| Satisfied | IF and ((a1/b1)>2.1, (a1/b1)<1000) THEN A1=.0284 |
| Comment | ;SECTION PROPERTIES OF VARIOUS BEAMS; |
| Satisfied | IF BM1=1 THEN I1=(((i1d*i1b^3)-(i1d1*i1b1^3))/12) ELSE I1=(((i1d+BM1_lam_thk)*((i1b+(BM1_lam_thk*2))^3))12) |

UNITED STATES PATENT AND TRADEMARK OFFICE
CERTIFICATE OF CORRECTION

PATENT NO. : 6,697,689 B2
DATED : February 24, 2004
INVENTOR(S) : Brent W. Lendriet It is certified that error appears in the above-identified patent and that said Letters Patent is hereby corrected as shown below:

Column 20 (cont'd),

| Satisfied | IF BM2=1 THEN I2=(((I2d*I2b^3)-(I2d1*I2b1^3))/12) ELSE I2=(((i2d+BM2_lam_thk)*((i2b+(BM2_lam_thk*2))^3))/12) |
|---|---|
| Satisfied | IF BM3=1 THEN I3=(((I3d*I3b^3)-(I3d1*I3b1^3))/12) ELSE I3=(((i3d+BM3_lam_thk)*((i3b+(BM3_lam_thk*2))^3))/12) |
| Satisfied | IF BM4=1 THEN I4=(((i4d*i4b^3)-(i4d1*i4b1^3))/12) ELSE I4=(((i4d+BM4_lam_thk)*((i4b+(BM4_lam_thk*2))^3))/12) |

Signed and Sealed this

Thirty-first Day of August, 2004

JON W. DUDAS
*Director of the United States Patent and Trademark Office*